US012525934B2

(12) United States Patent
Chen et al.

(10) Patent No.: US 12,525,934 B2
(45) Date of Patent: Jan. 13, 2026

(54) POWER AMPLIFIERS WITH BROADBAND MATCHING NETWORKS

(71) Applicant: Skyworks Solutions, Inc., Irvine, CA (US)

(72) Inventors: Kun Chen, Thousand Oaks, CA (US); Taesong Hwang, Camarillo, CA (US); Haibo Cao, Newbury Park, CA (US); Yu-Jui Lin, Westlake Village, CA (US); Min-Chung Vincent Ho, Newbury Park, CA (US); Aleksey A Lyalin, Moorpark, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 243 days.

(21) Appl. No.: 18/185,000

(22) Filed: Mar. 16, 2023

(65) Prior Publication Data
US 2023/0299729 A1 Sep. 21, 2023

Related U.S. Application Data

(60) Provisional application No. 63/269,495, filed on Mar. 17, 2022, provisional application No. 63/269,498, filed on Mar. 17, 2022.

(51) Int. Cl.
H03F 3/24 (2006.01)
H03F 1/02 (2006.01)
(Continued)

(52) U.S. Cl.
CPC ............ H03F 3/245 (2013.01); H03F 1/0216 (2013.01); H03F 1/483 (2013.01); H03F 1/56 (2013.01);
(Continued)

(58) Field of Classification Search
CPC ... H03F 3/24; H03F 3/245; H03F 1/56; H03F 2200/451; H03F 2200/387
See application file for complete search history.

(56) References Cited

U.S. PATENT DOCUMENTS 5,966,051 A 10/1999 Griffith
6,114,911 A 9/2000 Iwai et al.
(Continued)

FOREIGN PATENT DOCUMENTS

WO WO-2017136631 A1 * 8/2017 .......... H04W 52/245

OTHER PUBLICATIONS

Kaymaksut et al., "A dual-mode transformer-based Doherty LTE Power Amplifier in 40nm CMOS", IEEE, ISSCC, Session 3, RF Techniques 3.4, pp. 1-3 (2014).
(Continued)

Primary Examiner — Hai V Nguyen
(74) Attorney, Agent, or Firm — Knobbe, Martens, Olson & Bear, LLP

(57) ABSTRACT

Apparatus and methods for power amplifiers with broadband matching networks are disclosed. In certain embodiments, a mobile device includes a transceiver that generates a radio frequency input signal, and a front-end system including a compound semiconductor die and a silicon switch die. The compound semiconductor die includes a power amplifier including one or more power amplifier stages that amplify the radio frequency input signal to generate a radio frequency output signal. The silicon switch die includes a band selection switch that receives the radio frequency output signal. The compound semiconductor die and the silicon switch die each include at least one controllable impedance for providing a bandwidth adjustment to the power amplifier.

20 Claims, 21 Drawing Sheets

(51) Int. Cl.
  *H03F 1/48* (2006.01)
  *H03F 1/56* (2006.01)
  *H03F 3/213* (2006.01)
  *H04B 1/04* (2006.01)

(52) U.S. Cl.
  CPC ........... *H03F 3/213* (2013.01); *H04B 1/0458* (2013.01); *H03F 2200/09* (2013.01); *H03F 2200/387* (2013.01); *H03F 2200/451* (2013.01); *H04B 2001/0408* (2013.01)

(56) References Cited

U.S. PATENT DOCUMENTS

| | | | | |
|---|---|---|---|---|
| 7,006,553 | B1* | 2/2006 | McCorkle | H04B 1/719 |
| | | | | 370/324 |
| 7,315,564 | B2* | 1/2008 | McCorkle | H04B 1/719 |
| | | | | 375/130 |
| 7,557,551 | B1* | 7/2009 | Somerville | H04B 1/0483 |
| | | | | 455/127.1 |
| 7,593,698 | B1* | 9/2009 | Johnson | H03F 3/191 |
| | | | | 375/302 |
| 7,795,968 | B1* | 9/2010 | Li | H03F 3/72 |
| | | | | 330/129 |
| 8,072,272 | B2 | 12/2011 | Zhao et al. | |
| 8,405,147 | B2* | 3/2013 | Brindle | H10D 62/393 |
| | | | | 257/341 |
| 8,587,377 | B2 | 11/2013 | Khesbak et al. | |
| 8,593,219 | B1* | 11/2013 | Root | H03F 1/2088 |
| | | | | 330/124 R |
| 8,611,834 | B2* | 12/2013 | Harris | H03H 7/40 |
| | | | | 455/107 |
| 8,615,209 | B1* | 12/2013 | Khlat | H04B 1/18 |
| | | | | 455/127.1 |
| 8,742,502 | B2* | 6/2014 | Brindle | H10D 30/711 |
| | | | | 257/347 |
| 8,749,308 | B2* | 6/2014 | Wilson | H03F 1/0222 |
| | | | | 330/199 |
| 8,903,333 | B1* | 12/2014 | Khlat | H04B 1/525 |
| | | | | 343/750 |
| 9,020,455 | B1* | 4/2015 | Khlat | H04W 52/30 |
| | | | | 455/193.1 |
| 9,054,663 | B2 | 6/2015 | Reisner et al. | |
| 9,118,278 | B2* | 8/2015 | Wilson | H03F 1/025 |
| 9,190,958 | B2* | 11/2015 | Wilson | H03F 1/02 |
| 9,209,754 | B2* | 12/2015 | Embar | H03F 1/0288 |
| 9,219,444 | B2* | 12/2015 | Borodulin | H03F 1/3247 |
| 9,373,955 | B2* | 6/2016 | Chen | H01L 23/66 |
| 9,503,025 | B2 | 11/2016 | Cao et al. | |
| 9,515,621 | B2* | 12/2016 | Hietala | H03F 3/195 |
| 9,537,452 | B2* | 1/2017 | Samelis | H03F 3/195 |
| 9,641,132 | B2* | 5/2017 | Wilson | H03F 1/02 |
| 9,692,120 | B2* | 6/2017 | Chen | H01L 23/66 |
| 9,712,119 | B2 | 7/2017 | Datta et al. | |
| 9,787,256 | B1 | 10/2017 | Calanca | |
| 9,800,207 | B2 | 10/2017 | Datta et al. | |
| 9,935,593 | B2 | 4/2018 | Lyalin | |
| 9,948,243 | B2* | 4/2018 | Kobayashi | H03F 3/193 |
| 9,973,153 | B2* | 5/2018 | Samelis | H03F 1/565 |
| 10,038,414 | B2* | 7/2018 | Ranta | H03F 1/56 |
| 10,063,200 | B2 | 8/2018 | Wu et al. | |
| 10,069,462 | B1* | 9/2018 | Min | H03F 3/213 |
| 10,088,532 | B2 | 10/2018 | Ariyama | |
| 10,097,287 | B1* | 10/2018 | Schat | G01S 13/931 |
| 10,103,695 | B2* | 10/2018 | Jin | H03F 3/245 |
| 10,103,696 | B1* | 10/2018 | Mitzlaff | H01L 23/66 |
| 10,110,183 | B2 | 10/2018 | Lyalin et al. | |
| 10,135,405 | B2* | 11/2018 | Jin | H03F 3/195 |
| 10,135,408 | B2 | 11/2018 | Cao et al. | |
| 10,148,233 | B2* | 12/2018 | Jin | H03F 3/211 |
| 10,263,594 | B2 | 4/2019 | Lyalin et al. | |
| 10,276,521 | B2* | 4/2019 | Babcock | H01L 23/66 |
| 10,326,443 | B2 | 6/2019 | Ho | |
| 10,355,647 | B2 | 7/2019 | Datta et al. | |
| 10,411,660 | B1 | 9/2019 | Ortiz et al. | |
| 10,511,272 | B2* | 12/2019 | Lyalin | |
| 10,581,387 | B2* | 3/2020 | Ranta | H03F 3/213 |
| 10,581,388 | B2* | 3/2020 | Jin | H03F 3/605 |
| 10,658,991 | B2 | 5/2020 | Lyalin et al. | |
| 10,673,386 | B2* | 6/2020 | McLaren | H03F 3/601 |
| 10,673,387 | B2* | 6/2020 | Srindhi | H03F 3/601 |
| 10,778,152 | B2 | 9/2020 | Lyalin et al. | |
| 10,790,390 | B2* | 9/2020 | Brindle | H01D 30/711 |
| 10,826,457 | B2* | 11/2020 | Chi | H03F 3/45179 |
| 10,903,806 | B2 | 1/2021 | Anderson et al. | |
| 11,005,432 | B2 | 5/2021 | Ranta et al. | |
| 11,031,915 | B2 | 6/2021 | Lyalin | |
| 11,056,765 | B2* | 7/2021 | Kamgaing | H01L 23/3128 |
| 11,081,472 | B2* | 8/2021 | Noquil | H01L 23/3185 |
| 11,101,775 | B2 | 8/2021 | Datta et al. | |
| 11,201,600 | B1* | 12/2021 | Steinbrecher | H03H 7/12 |
| 11,283,416 | B2 | 3/2022 | Cao et al. | |
| 11,394,410 | B2* | 7/2022 | Domino | H04B 1/0458 |
| 11,451,199 | B2* | 9/2022 | Ripley | H01L 22/14 |
| 11,469,725 | B2 | 10/2022 | Cao et al. | |
| 11,576,248 | B2* | 2/2023 | Wallis | H03F 1/223 |
| 11,652,448 | B2* | 5/2023 | Hampel | H03F 3/189 |
| | | | | 375/219 |
| 11,804,435 | B2* | 10/2023 | Liu | H03F 3/245 |
| 11,864,295 | B2* | 1/2024 | Soliman | H03F 1/3205 |
| 11,953,926 | B2* | 4/2024 | Liang | G05F 1/575 |
| 11,973,467 | B2* | 4/2024 | Balteanu | H03F 1/0227 |
| 11,973,474 | B2* | 4/2024 | Wang | H03F 3/45179 |
| 11,978,701 | B2* | 5/2024 | Zhou | H01L 23/291 |
| 12,015,019 | B2* | 6/2024 | Noquil | H01L 23/4334 |
| 12,081,179 | B2* | 9/2024 | King | H04B 1/40 |
| 12,095,422 | B2* | 9/2024 | Gebeyehu | H03F 3/245 |
| 12,095,430 | B2* | 9/2024 | King | H04B 1/40 |
| 12,143,077 | B2* | 11/2024 | Zampardi, Jr. | H10D 62/85 |
| 12,206,363 | B2* | 1/2025 | Lehtola | H03F 3/211 |
| 12,279,353 | B2* | 4/2025 | Khoury | H03F 1/347 |
| 12,294,360 | B2* | 5/2025 | de Vreede | H03K 17/6871 |
| 12,334,880 | B2 | 6/2025 | Datta et al. | |
| 12,355,403 | B2* | 7/2025 | Ranta | H03F 1/56 |
| 12,375,046 | B2* | 7/2025 | Datta | H04B 1/0458 |
| 2008/0094149 | A1 | 4/2008 | Brobston | |
| 2011/0095827 | A1 | 4/2011 | Tanaka et al. | |
| 2013/0135043 | A1* | 5/2013 | Hietala | H03F 3/245 |
| | | | | 330/124 R |
| 2013/0194158 | A1* | 8/2013 | Chen | H01L 23/66 |
| | | | | 343/876 |
| 2014/0266531 | A1* | 9/2014 | Leipold | H03F 1/3241 |
| | | | | 336/170 |
| 2015/0180426 | A1* | 6/2015 | Kingsley | H03F 1/565 |
| | | | | 330/296 |
| 2015/0280685 | A1* | 10/2015 | Goumas | H03H 7/383 |
| | | | | 333/35 |
| 2015/0311874 | A1* | 10/2015 | Samelis | H03F 3/245 |
| | | | | 455/114.1 |
| 2016/0118944 | A1 | 4/2016 | Data et al. | |
| 2016/0191019 | A1* | 6/2016 | Reedy | H03H 11/28 |
| | | | | 307/98 |
| 2016/0352008 | A1* | 12/2016 | Chen | H01D 1/47 |
| 2017/0149392 | A1* | 5/2017 | Zhao | H03F 1/565 |
| 2017/0160318 | A1* | 6/2017 | Zhang | G01R 31/2822 |
| 2017/0170792 | A1* | 6/2017 | Samelis | H03F 3/72 |
| 2017/0230066 | A1* | 8/2017 | Little | H04B 1/401 |
| 2017/0337866 | A1* | 11/2017 | Ikeda | G09G 3/2092 |
| 2017/0365720 | A1* | 12/2017 | Asami | H01D 30/683 |
| 2018/0006618 | A1* | 1/2018 | Mohta | H04B 1/0475 |
| 2018/0034418 | A1* | 2/2018 | Blednov | H03F 3/195 |
| 2018/0138866 | A1* | 5/2018 | Liang | H03K 3/011 |
| 2018/0159486 | A1* | 6/2018 | Ranta | H03F 3/213 |
| 2018/0226367 | A1* | 8/2018 | Babcock | H03F 1/32 |
| 2018/0294558 | A1* | 10/2018 | Hoang | H01Q 9/42 |
| 2019/0140602 | A1* | 5/2019 | Ranta | H03F 1/56 |
| 2019/0173431 | A1* | 6/2019 | Srinidhi Embar | H01L 23/66 |
| 2019/0173435 | A1* | 6/2019 | McLaren | H03F 1/56 |
| 2019/0245508 | A1 | 8/2019 | Lyalin et al. | |
| 2019/0253087 | A1* | 8/2019 | Domino | H04B 1/18 |
| 2019/0288371 | A1* | 9/2019 | Kamgaing | H01L 23/3128 |
| 2019/0393921 | A1* | 12/2019 | Sengupta | H04B 7/0413 |
| 2020/0228064 | A1* | 7/2020 | Datta | H03F 1/56 |

(56) References Cited

U.S. PATENT DOCUMENTS

| | | | |
|---|---|---|---|
| 2020/0235709 A1* | 7/2020 | Ranta | H03F 3/19 |
| 2020/0350878 A1* | 11/2020 | Drogi | H04W 52/52 |
| 2021/0050826 A1* | 2/2021 | Ripley | H01L 23/50 |
| 2021/0075371 A1* | 3/2021 | Chatterjee | H03F 1/56 |
| 2021/0082889 A1* | 3/2021 | Noquil | H01L 25/50 |
| 2021/0083510 A1 | 3/2021 | Liu et al. | |
| 2021/0135639 A1 | 5/2021 | Jones et al. | |
| 2021/0152131 A1* | 5/2021 | Benson | G01K 13/00 |
| 2021/0175166 A1* | 6/2021 | McGahay | H01L 23/53295 |
| 2021/0210429 A1* | 7/2021 | Liu | H03F 3/245 |
| 2021/0211107 A1* | 7/2021 | Liu | H04B 1/40 |
| 2021/0320093 A1* | 10/2021 | Noquil | H01L 23/5386 |
| 2021/0336588 A1* | 10/2021 | Ranta | H03F 3/213 |
| 2021/0384868 A1 | 12/2021 | Datta et al. | |
| 2021/0399423 A1* | 12/2021 | Hoang | H01Q 5/35 |
| 2022/0014152 A1* | 1/2022 | Gebeyehu | H04B 1/401 |
| 2022/0069787 A1* | 3/2022 | King | H04B 1/40 |
| 2022/0069788 A1* | 3/2022 | King | H03F 3/195 |
| 2022/0103139 A1 | 3/2022 | Domino et al. | |
| 2022/0131505 A1 | 4/2022 | Snai et al. | |
| 2022/0189936 A1 | 6/2022 | Tsutsui et al. | |
| 2022/0200543 A1* | 6/2022 | Wang | |
| 2022/0200548 A1* | 6/2022 | Fukasawa | H03F 3/195 |
| 2022/0231640 A1 | 7/2022 | Lyalin | |
| 2022/0247360 A1* | 8/2022 | Hampel | H04B 1/40 |
| 2022/0278650 A1* | 9/2022 | Ripley | H03F 1/223 |
| 2022/0321066 A1 | 10/2022 | Hu et al. | |
| 2022/0359523 A1* | 11/2022 | Sato | H01L 23/5329 |
| 2022/0368149 A1* | 11/2022 | Katagiri | H01M 10/44 |
| 2022/0376662 A1* | 11/2022 | Datta | H03F 3/245 |
| 2022/0376733 A1* | 11/2022 | Datta | H03F 3/195 |
| 2022/0385237 A1* | 12/2022 | Lehtola | H03F 3/19 |
| 2022/0393653 A1* | 12/2022 | Zampardi, Jr. | H01L 23/66 |
| 2023/0024830 A1* | 1/2023 | Datta | H03F 3/265 |
| 2023/0054485 A1* | 2/2023 | Hoversten | H03F 1/32 |
| 2023/0080564 A1* | 3/2023 | Pehlke | H03F 1/56 330/51 |
| 2023/0088469 A1* | 3/2023 | Raghavan | H04B 1/0057 455/73 |
| 2023/0246602 A1* | 8/2023 | Ranta | H03F 1/56 |
| 2023/0327615 A1* | 10/2023 | Chen | H03F 1/56 |
| 2023/0328960 A1* | 10/2023 | Kim | H01B 12/053 |
| 2023/0370026 A1* | 11/2023 | Tuffy | H03F 1/0261 |
| 2023/0370027 A1* | 11/2023 | Tuffy | H03F 1/565 |
| 2023/0394201 A1* | 12/2023 | Tuffy | G06F 30/36 |
| 2023/0396220 A1* | 12/2023 | Tuffy | H03F 1/0288 |
| 2024/0048107 A1* | 2/2024 | Oh | H03H 7/09 |
| 2024/0072053 A1* | 2/2024 | Yoon | H10D 30/701 |
| 2024/0088846 A1* | 3/2024 | Balteanu | H03F 3/245 |
| 2024/0098864 A1* | 3/2024 | Khoury | H04B 1/0475 |
| 2024/0203895 A1* | 6/2024 | Lan | H01L 23/552 |
| 2024/0204738 A1* | 6/2024 | Tuffy | H03F 1/56 |
| 2024/0267064 A1* | 8/2024 | Leung | H04B 1/525 |
| 2024/0275340 A1* | 8/2024 | Litchfield | H03F 3/195 |
| 2024/0319251 A1* | 9/2024 | Rathsmann | G01R 31/086 |
| 2025/0211180 A1* | 6/2025 | Domino | H03F 3/195 |
| 2025/0247116 A1* | 7/2025 | Chen | H04B 1/1036 |

OTHER PUBLICATIONS

Kaymaksut et al., "Dual-mode CMOS doherty LTE power amplifier with symmetirc hybrid transformer", IEEE Journal of Solid-State Circuits, vol. 50(9):1974-1987 (2015).

Kaymaksut et al., "Transformer-based Doherty Power Amplifiers for mm-Wave applications in 40-nm CMOS", IEEE Transaction son Microwave Theory and Techniques, vol. 63(4):1186-1192 (2015).

Kaymaksut et al., "A 2.4 GHz fully integrated Doherty Power Amplifier using series combinign transformer", IEEE, pp. 302-305 (2010).

Medhat et al., "A fully-integrated 40nm CMOS 58.1% PAE push-oull class-E/$F_{odd}$ power amplifier for NB-IoT applications", IEEE pp. 1-4 (2022).

Spirito et al., "Low-loss passives for 2nd-harmonic termination control in power amplifiers for mobile applications", IEEE, pp. 49-52 (2003).

Zhou et al., "A high-efficiency E-band SiGe HBT frequency tripler with broadband performance", IEEE, pp. 690-693 (2018).

* cited by examiner

POWER AMPLIFIERS WITH BROADBAND MATCHING NETWORKS

CROSS-REFERENCE TO RELATED APPLICATIONS

This application claims the benefit of priority under 35 U.S.C. § 119 of U.S. Provisional Patent Application No. 63/269,495, filed Mar. 17, 2022 and titled "POWER AMPLIFIERS WITH BROADBAND MATCHING NETWORKS," and of Provisional Patent Application No. 63/269,498, filed Mar. 17, 2022 and titled "POWER AMPLIFIER SYSTEMS WITH BALUN AND SHUNT CAPACITOR," each of which is herein incorporated by reference in its entirety.

BACKGROUND

Field

Embodiments of the invention relate to electronic systems, and in particular, to radio frequency electronics.

Description of Related Technology

Radio frequency (RF) communication systems can be used for transmitting and/or receiving signals of a wide range of frequencies. For example, an RF communication system can be used to wirelessly communicate RF signals in a frequency range of about 30 kHz to 300 GHz, such as in the range of about 410 MHz to about 7.125 GHz for Fifth Generation (5G) cellular communications in Frequency Range 1 (FR1) or in the range of about 24.250 GHz to about 71.000 GHz for Frequency Range 2 (FR2) of the 5G communication standard.

Examples of RF communication systems include, but are not limited to, mobile phones, tablets, base stations, network access points, customer-premises equipment (CPE), laptops, and wearable electronics.

SUMMARY

In certain embodiments, the present disclosure relates to a mobile device. The mobile device includes a transceiver configured to generate a radio frequency input signal, and a front-end system including a compound semiconductor die and a silicon switch die. The compound semiconductor die includes a first controllable impedance and a power amplifier including one or more power amplifier stages configured to amplify the radio frequency input signal to generate a radio frequency output signal. The silicon switch die includes a band selection switch configured to receive the radio frequency output signal and a second controllable impedance. The first controllable impedance and the second controllable impedance are operable to provide a bandwidth adjustment to the power amplifier.

In some embodiments, the front-end system further includes a balun having an input side coupled to the one or more power amplifier stages and an output side coupled to the band selection switch. According to a number of embodiments, the first controllable impedance includes a first controllable capacitor formed on the compound semiconductor die and in shunt with a first output of a first power amplifier stage of the one or more power amplifier stages, and the second controllable impedance includes a second controllable capacitor formed on the silicon switch die and in series between the output side of the balun and the band selection switch. In accordance with various embodiments, the mobile device further includes an inductor in parallel with the second controllable capacitor.

In several embodiments, the silicon switch die is a silicon-on-insulator die.

In various embodiments, the front-end system further includes a plurality of band filters, the band selection switch configured to provide the radio frequency output signal to a selected band filter chosen from the plurality of band filters.

In some embodiments, the one or more power amplifier stages includes two or more power amplifier stages configured to operate in parallel with one another to amplify the radio frequency input signal. According to a number of embodiments, the front-end system further includes a balun, and the two or more power amplifier stages include a first power amplifier stage having a first output coupled to a first input terminal of the balun, and a second power amplifier stage having a second output coupled to a second input terminal of the balun. In accordance with several embodiments, the front-end system further includes an impedance inverter, and the two or more power amplifier stages further includes a third power amplifier stage having a third output connected to the first terminal of the balun through the impedance inverter, and a fourth power amplifier stage having a fourth output connected to the second input terminal of the balun through the impedance inverter.

In certain embodiments, the present disclosure relates to a method of radio frequency signal amplification in a mobile device. The method includes generating a radio frequency input signal using a transceiver, amplifying the radio frequency input signal to generate a radio frequency output signal using a power amplifier having one or more power amplifier stages formed on a compound semiconductor die, providing the radio frequency output signal to a band selection switch formed on a silicon switch die, and providing a bandwidth adjustment to the power amplify by controlling a first controllable impedance formed on the compound semiconductor die and a second controllable impedance formed on the semiconductor switch die.

In several embodiments, amplifying the radio frequency input signal includes using two or more power amplifier stages operating in parallel with one another to provide amplification.

In some embodiments, the method further includes using the band selection switch to provide the radio frequency output signal to a selected band filter chosen from a plurality of band filters.

In certain embodiments, the present disclosure relates to a radio frequency multi-chip module. The radio frequency multi-chip module includes a module substrate, a compound semiconductor die attached to the module substrate, and a silicon switch die attached to the module substrate. The compound semiconductor die includes a first controllable impedance and a power amplifier that includes one or more power amplifier stages configured to amplify a radio frequency input signal to generate a radio frequency output signal. The silicon switch die includes a band selection switch configured to receive the radio frequency output signal and a second controllable impedance. The first controllable impedance and the second controllable impedance configured to provide a bandwidth adjustment to the power amplifier.

In some embodiments, the radio frequency multi-chip module further includes a balun having an input side coupled to the one or more power amplifier stages and an output side coupled to the band selection switch. According to a number of embodiments, the first controllable impedance includes a first controllable capacitor formed on the compound semiconductor die and in shunt with a first output of a first power amplifier stage of the one or more power amplifier stages, and the second controllable impedance includes a second controllable capacitor formed on the silicon switch die and in series between the output side of the balun and the band selection switch.

In various embodiments, the silicon switch die is a silicon-on-insulator die. In several embodiments, the radio frequency multi-chip module further includes a plurality of band filters attached to the module substrate, the band selection switch configured to provide the radio frequency output signal to a selected band filter chosen from the plurality of band filters.

In several embodiments, the one or more power amplifier stages include two or more power amplifier stages configured to operate in parallel with one another to amplify the radio frequency input signal. According to a number of embodiments, the radio frequency multi-chip module further includes a balun, and the two or more power amplifier stages include a first power amplifier stage having a first output coupled to a first input terminal of the balun, and a second power amplifier stage having a second output coupled to a second input terminal of the balun. In accordance with some embodiments, the radio frequency multi-chip module further includes an impedance inverter, and the two or more power amplifier stages further includes a third power amplifier stage having a third output connected to the first terminal of the balun through the impedance inverter, and a fourth power amplifier stage having a fourth output connected to the second input terminal of the balun through the impedance inverter.

In certain embodiments, the present disclosure relates to a mobile device. The mobile device includes a transceiver configured to generate a radio frequency input signal, and a front-end system including a first shunt capacitor, a balun having an input side and an output side, and a plurality of power amplifier stages configured to operate in parallel with one another to amplify the radio frequency input signal. The plurality of power amplifier stages include a first power amplifier stage having a first output coupled to the first shunt capacitor and to a first input terminal on the input side of the balun, and a second power amplifier stage having a second output coupled to a second input terminal on the input side of the balun.

In various embodiments, the balun further includes a center tap on the input side between the first input terminal and the second input terminal, and the front-end system further includes a first input side termination network and a second input side termination network connected in parallel with one another between the center tap and a ground voltage. According to a number of embodiments, the first input side termination network is configured to resonate at a fundamental frequency of the radio frequency input signal, and the second input side termination network is configured to resonate at a second harmonic frequency of the radio frequency input signal.

In some embodiments, the output side of the balun includes a first output terminal configured to output a radio frequency output signal and a second output terminal connected to a ground voltage.

In various embodiments, the input side of the balun presents an inductive load.

In several embodiments, the first shunt capacitor has a controllable capacitance value.

In some embodiments, the first shunt capacitor is directly connected between the first input terminal of the input side of the balun and a ground voltage.

In various embodiments, the front-end system further includes a second shunt capacitor connected to the second input terminal of the input side of the balun.

In some embodiments, the front-end system further includes an impedance inverter, and the plurality of power amplifier stages further includes a third power amplifier stage having a third output connected to the first terminal of the balun through the impedance inverter, and a fourth power amplifier stage having a fourth output connected to the second input terminal of the balun through the impedance inverter.

In several embodiments, the first shunt capacitor is configured to extend an operating bandwidth of the plurality of power amplifier stages.

In certain embodiments, the present disclosure relates to a method of radio frequency signal amplification in a mobile device. The method includes generating a radio frequency input signal using a transceiver, amplifying the radio frequency input signal using a plurality of power amplifier stages operating in parallel with one another, and driving an input side of a balun using the plurality of power amplifier stages. The plurality of power amplifier stages includes a first power amplifier stage having a first output coupled to the first shunt capacitor and to a first input terminal on the input side of the balun, and a second power amplifier stage having a second output coupled to a second input terminal on the input side of the balun.

In various embodiments, the method further includes setting a controllable capacitance value of the first shunt capacitor.

In several embodiments, the method further includes outputting a radio frequency output signal from a first output terminal of an output side of the balun, and grounding a second output terminal of the output side of the balun.

In certain embodiments, the present disclosure relates to a radio frequency module. The radio frequency module includes a module substrate, a balun on the module substrate and having an input side and an output side, a first shunt capacitor, and a semiconductor chip attached to the module substrate and including a plurality of power amplifier stages configured to operate in parallel with one another to amplify the radio frequency input signal. The plurality of power amplifier stages includes a first power amplifier stage having a first output coupled to the first shunt capacitor and to a first input terminal of the balun, and a second power amplifier stage having a second output coupled to a second input terminal of the balun.

In some embodiments, the balun further includes a center tap on the input side between the first input terminal and the second input terminal, the radio frequency module further including a first input side termination network and a second input side termination network connected in parallel with one another between the center tap and a ground voltage. According to a number of embodiments, the first input side termination network is configured to resonate at a fundamental frequency of the radio frequency input signal, and the second input side termination network is configured to resonate at a second harmonic frequency of the radio frequency input signal.

In several embodiments, the output side of the balun includes a first output terminal configured to output a radio frequency output signal and a second output terminal connected to a ground voltage.

In various embodiments, the input side of the balun presents an inductive load.

In some embodiments, the first shunt capacitor is formed on the semiconductor die.

In several embodiments, the radio frequency module further includes an impedance inverter, the plurality of power amplifier stages further including a third power amplifier stage having a third output connected to the first terminal of the balun through the impedance inverter, and a fourth power amplifier stage having a fourth output connected to the second input terminal of the balun through the impedance inverter.

DETAILED DESCRIPTION OF EMBODIMENTS

Figure 1:
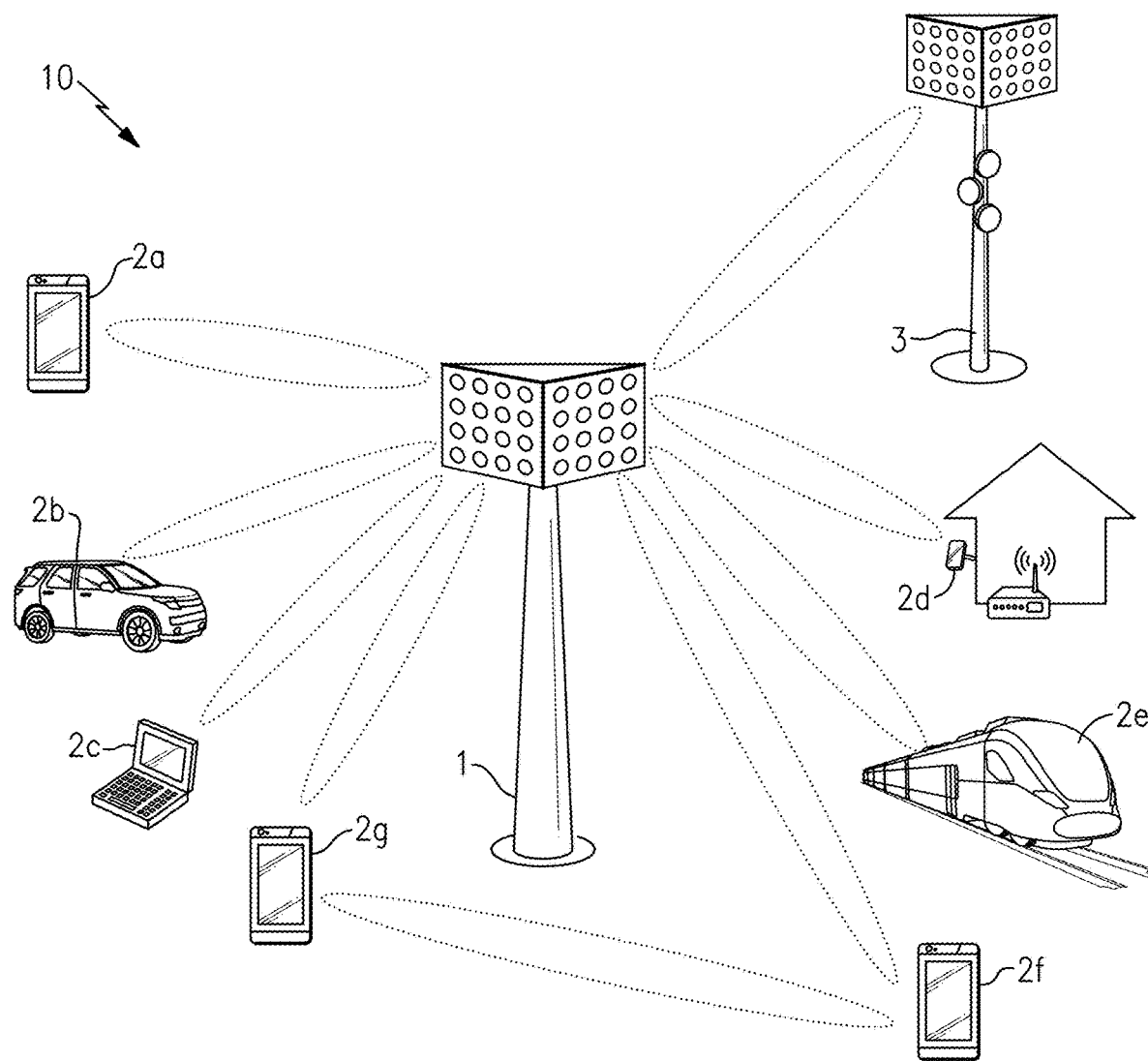
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and introduced Phase 2 of 5G technology in Release 16. Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, a second mobile device 2f, and a third mobile device 2g.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul (for instance, as between mobile device 2g and mobile device 2f).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz. Cellular user equipment can communicate using beamforming and/or other techniques over a wide range of frequencies, including, for example, FR2-1 (24 GHz to 52 GHz), FR2-2 (52 GHz to 71 GHz), and/or FR1 (400 MHz to 7125 MHz).

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

In certain implementations, the communication network 10 supports supplementary uplink (SUL) and/or supplementary downlink (SDL). For example, when channel conditions are good, the communication network 10 can direct a particular UE to transmit using an original uplink frequency, while when channel condition is poor (for instance, below a certain criteria) the communication network 10 can direct the UE to transmit using a supplementary uplink frequency that is lower than the original uplink frequency. Since cell coverage increases with lower frequency, communication range and/or signal-to-noise ratio (SNR) can be increased using SUL. Likewise, SDL can be used to transmit using an original downlink frequency when channel conditions are good, and to transmit using a supplementary downlink frequency when channel conditions are poor.

Figure 2A:
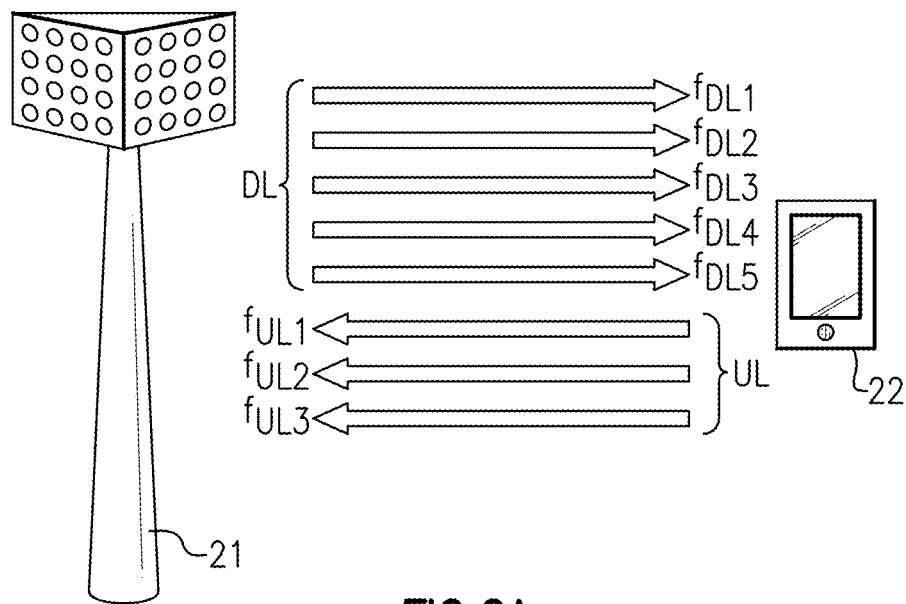
FIG. 2A is a schematic diagram of one example of a communication link using carrier aggregation.

FIG. 2A is a schematic diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations.

In the illustrated example, the communication link is provided between a base station 21 and a mobile device 22. As shown in FIG. 2A, the communications link includes a downlink channel used for RF communications from the base station 21 to the mobile device 22, and an uplink channel used for RF communications from the mobile device 22 to the base station 21.

Although FIG. 2A illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 21 and the mobile device 22 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 2A, the uplink channel includes three aggregated component carriers $f_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

Figure 2B:
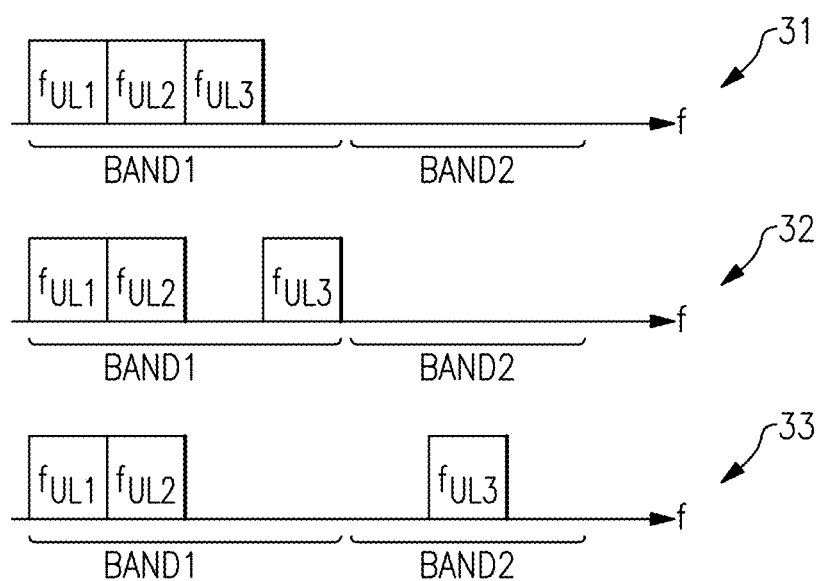
FIG. 2B illustrates various examples of uplink carrier aggregation for the communication link of FIG. 2A.

FIG. 2B illustrates various examples of uplink carrier aggregation for the communication link of FIG. 2A. FIG. 2B includes a first carrier aggregation scenario 31, a second carrier aggregation scenario 32, and a third carrier aggregation scenario 33, which schematically depict three types of carrier aggregation.

The carrier aggregation scenarios 31-33 illustrate different spectrum allocations for a first component carrier $f_{UL1}$, a second component carrier $f_{UL2}$, and a third component carrier $f_{UL3}$. Although FIG. 2B is illustrated in the context of aggregating three component carriers, carrier aggregation can be used to aggregate more or fewer carriers. Moreover, although illustrated in the context of uplink, the aggregation scenarios are also applicable to downlink.

The first carrier aggregation scenario 31 illustrates intra-band contiguous carrier aggregation, in which component carriers that are adjacent in frequency and in a common frequency band are aggregated. For example, the first carrier aggregation scenario 31 depicts aggregation of component carriers $f_{UL1}$, $f_{UL2}$, and $f_{UL3}$ that are contiguous and located within a first frequency band BAND1.

With continuing reference to FIG. 2B, the second carrier aggregation scenario 32 illustrates intra-band non-continuous carrier aggregation, in which two or more components carriers that are non-adjacent in frequency and within a common frequency band are aggregated. For example, the second carrier aggregation scenario 32 depicts aggregation of component carriers $f_{UL1}$, $f_{UL2}$, and $f_{UL3}$ that are non-contiguous, but located within a first frequency band BAND1.

The third carrier aggregation scenario 33 illustrates inter-band non-contiguous carrier aggregation, in which component carriers that are non-adjacent in frequency and in multiple frequency bands are aggregated. For example, the third carrier aggregation scenario 33 depicts aggregation of component carriers $f_{UL1}$ and $f_{UL2}$ of a first frequency band BAND1 with component carrier $f_{UL3}$ of a second frequency band BAND2.

Figure 2C:
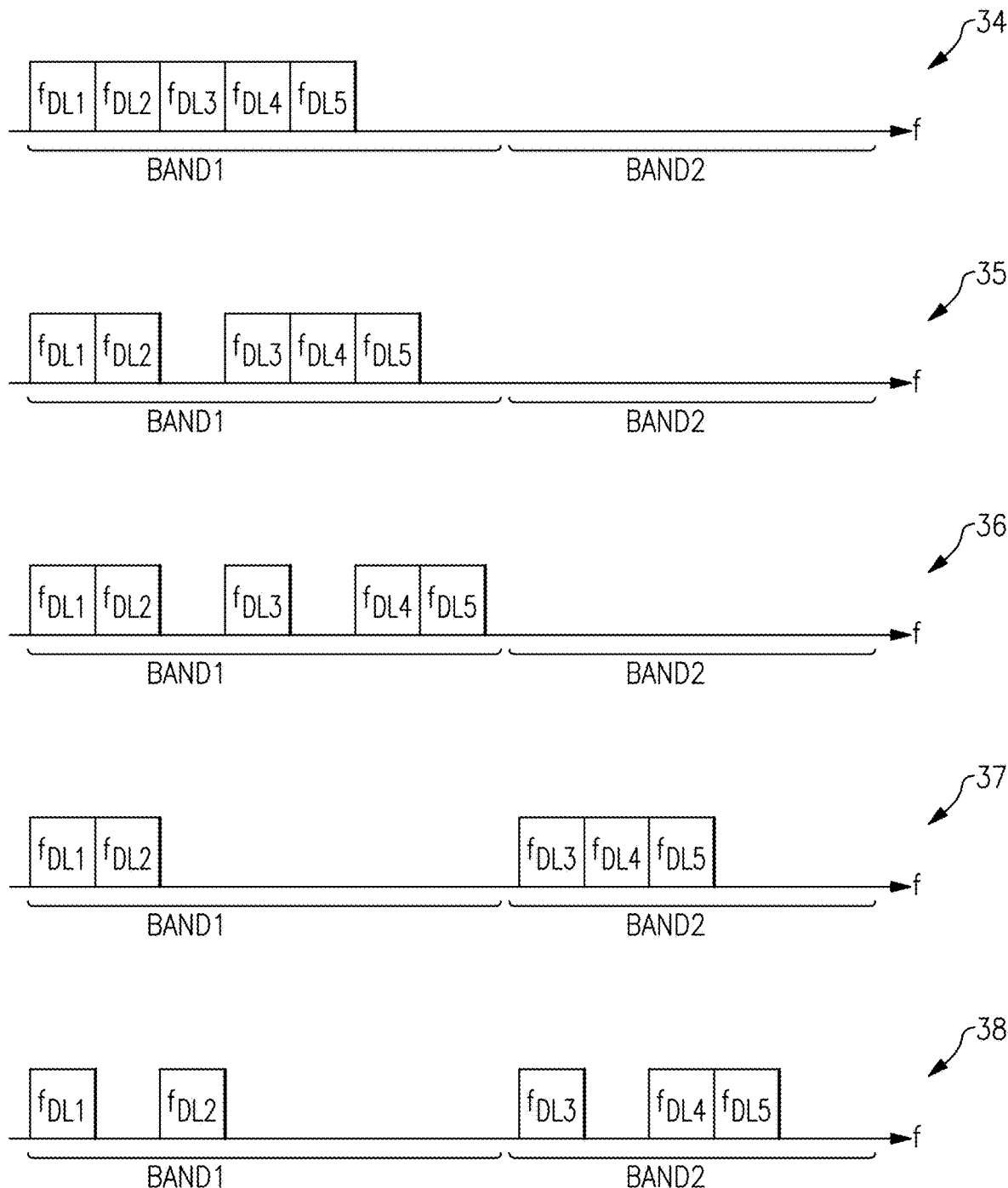
FIG. 2C illustrates various examples of downlink carrier aggregation for the communication link of FIG. 2A.

FIG. 2C illustrates various examples of downlink carrier aggregation for the communication link of FIG. 2A. The examples depict various carrier aggregation scenarios 34-38 for different spectrum allocations of a first component carrier $f_{DL1}$, a second component carrier $f_{DL2}$, a third component carrier $f_{DL3}$, a fourth component carrier $f_{DL4}$, and a fifth component carrier $f_{DL5}$. Although FIG. 2C is illustrated in the context of aggregating five component carriers, carrier aggregation can be used to aggregate more or fewer carriers. Moreover, although illustrated in the context of downlink, the aggregation scenarios are also applicable to uplink.

The first carrier aggregation scenario 34 depicts aggregation of component carriers that are contiguous and located within the same frequency band. Additionally, the second carrier aggregation scenario 35 and the third carrier aggregation scenario 36 illustrates two examples of aggregation that are non-contiguous, but located within the same frequency band. Furthermore, the fourth carrier aggregation scenario 37 and the fifth carrier aggregation scenario 38 illustrates two examples of aggregation in which component carriers that are non-adjacent in frequency and in multiple frequency bands are aggregated. As a number of aggregated component carriers increases, a complexity of possible carrier aggregation scenarios also increases.

With reference to FIGS. 2A-2C, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Certain communication networks allocate a particular user device with a primary component carrier (PCC) or anchor carrier for uplink and a PCC for downlink. Additionally, when the mobile device communicates using a single frequency carrier for uplink or downlink, the user device communicates using the PCC. To enhance bandwidth for uplink communications, the uplink PCC can be aggregated with one or more uplink secondary component carriers (SCCs). Additionally, to enhance bandwidth for downlink communications, the downlink PCC can be aggregated with one or more downlink SCCs.

In certain implementations, a communication network provides a network cell for each component carrier. Additionally, a primary cell can operate using a PCC, while a secondary cell can operate using a SCC. The primary and secondary cells may have different coverage areas, for instance, due to differences in frequencies of carriers and/or network environment.

License assisted access (LAA) refers to downlink carrier aggregation in which a licensed frequency carrier associated with a mobile operator is aggregated with a frequency carrier in unlicensed spectrum, such as WiFi. LAA employs a downlink PCC in the licensed spectrum that carries control and signaling information associated with the communication link, while unlicensed spectrum is aggregated for wider downlink bandwidth when available. LAA can operate with dynamic adjustment of secondary carriers to avoid WiFi users and/or to coexist with WiFi users. Enhanced license assisted access (eLAA) refers to an evolution of LAA that aggregates licensed and unlicensed spectrum for both downlink and uplink. Furthermore, NR-U can operate on top of LAA/eLAA over a 5 GHz band (5150 to 5925 MHz) and/or a 6 GHz band (5925 MHz to 7125 MHz).

Figure 3A:
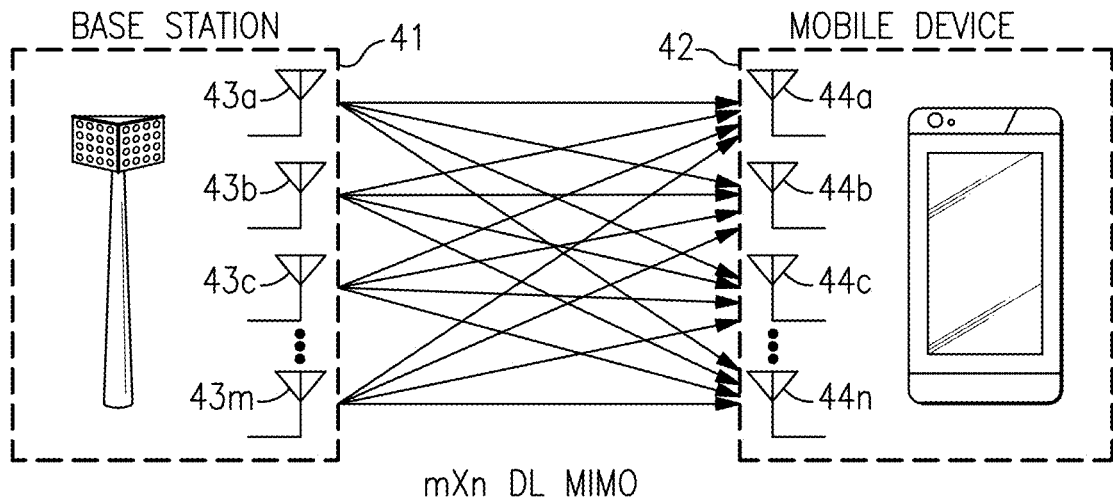
FIG. 3A is a schematic diagram of one example of a downlink channel using multi-input and multi-output (MIMO) communications.
Figure 3B:
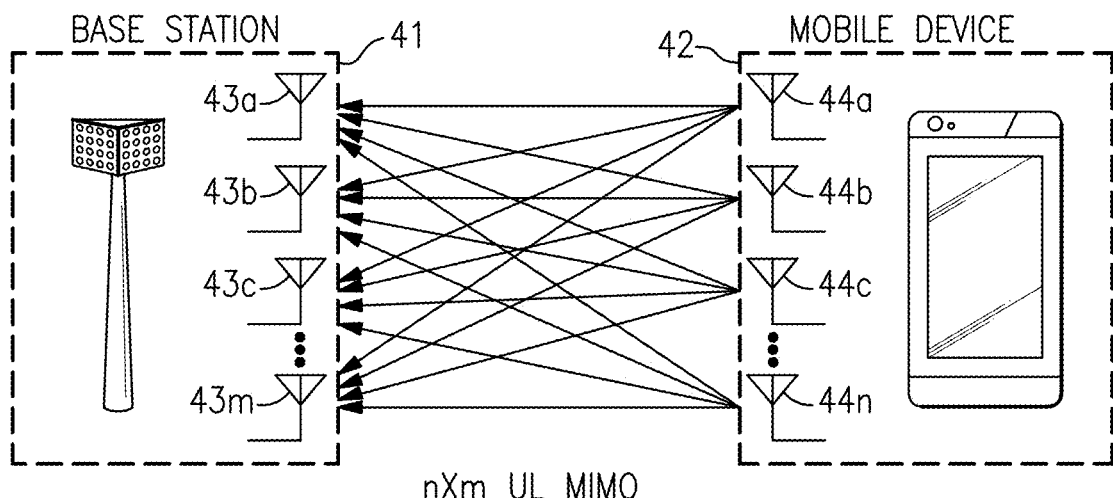
FIG. 3B is schematic diagram of one example of an uplink channel using MIMO communications.

FIG. 3A is a schematic diagram of one example of a downlink channel using multi-input and multi-output (MIMO) communications. FIG. 3B is schematic diagram of one example of an uplink channel using MIMO communications.

MIMO communications use multiple antennas for simultaneously communicating multiple data streams over common frequency spectrum. In certain implementations, the data streams operate with different reference signals to enhance data reception at the receiver. MIMO communications benefit from higher SNR, improved coding, and/or reduced signal interference due to spatial multiplexing differences of the radio environment.

MIMO order refers to a number of separate data streams sent or received. For instance, MIMO order for downlink communications can be described by a number of transmit antennas of a base station and a number of receive antennas for UE, such as a mobile device. For example, two-by-two (2×2) DL MIMO refers to MIMO downlink communications using two base station antennas and two UE antennas. Additionally, four-by-four (4×4) DL MIMO refers to MIMO downlink communications using four base station antennas and four UE antennas.

In the example shown in FIG. 3A, downlink MIMO communications are provided by transmitting using M antennas 43a, 43b, 43c, . . . 43m of the base station 41 and receiving using N antennas 44a, 44b, 44c, . . . 44n of the mobile device 42. Accordingly, FIG. 3A illustrates an example of m×n DL MIMO.

Likewise, MIMO order for uplink communications can be described by a number of transmit antennas of UE, such as a mobile device, and a number of receive antennas of a base station. For example, 2×2 UL MIMO refers to MIMO uplink communications using two UE antennas and two base station antennas. Additionally, 4×4 UL MIMO refers to MIMO uplink communications using four UE antennas and four base station antennas.

In the example shown in FIG. 3B, uplink MIMO communications are provided by transmitting using N antennas 44a, 44b, 44c, . . . 44n of the mobile device 42 and receiving using M antennas 43a, 43b, 43c, . . . 43m of the base station 41. Accordingly, FIG. 3B illustrates an example of n×m UL MIMO.

By increasing the level or order of MIMO, bandwidth of an uplink channel and/or a downlink channel can be increased.

MIMO communications are applicable to communication links of a variety of types, such as FDD communication links and TDD communication links.

Figure 3C:
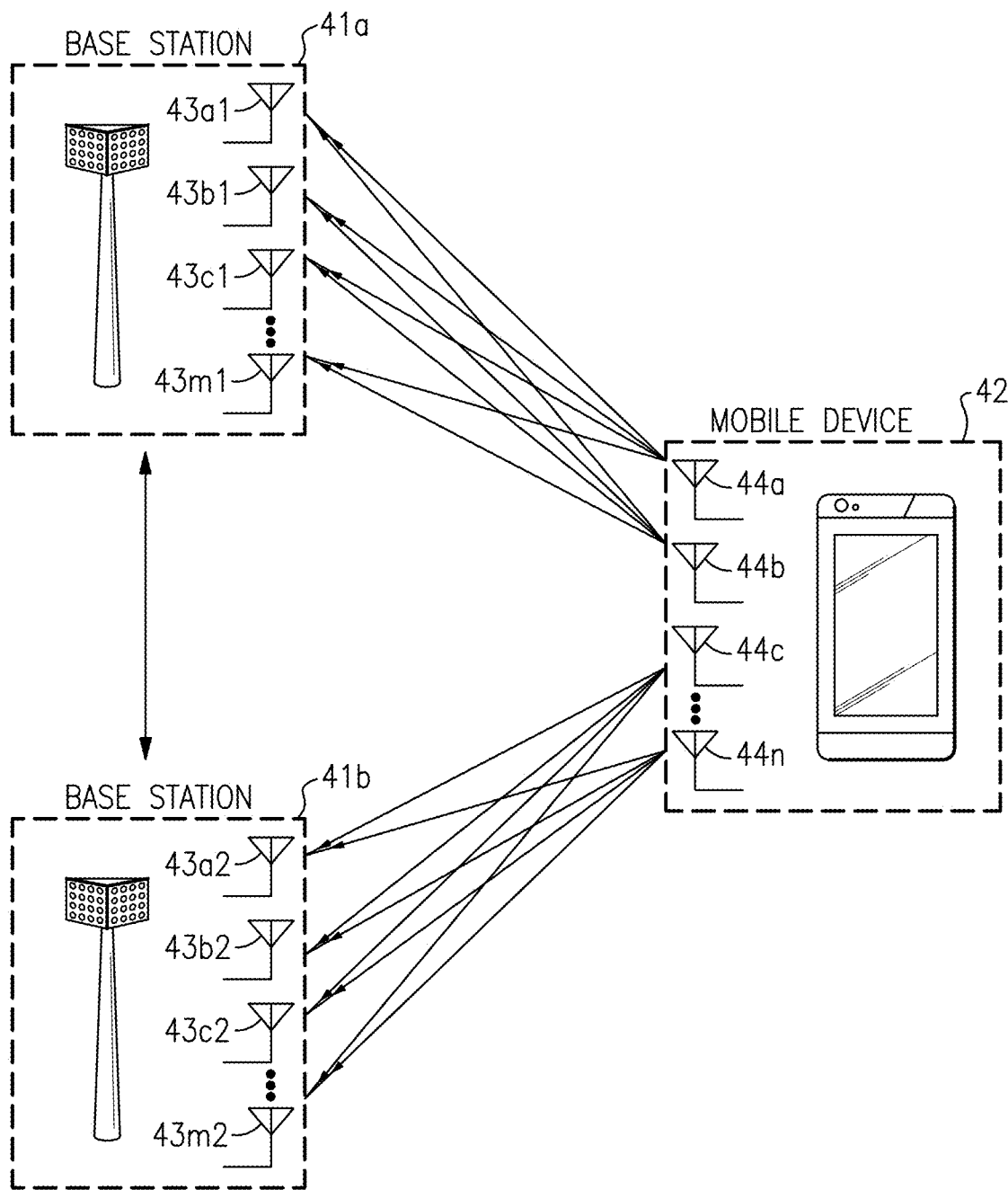
FIG. 3C is schematic diagram of another example of an uplink channel using MIMO communications.

FIG. 3C is schematic diagram of another example of an uplink channel using MIMO communications. In the example shown in FIG. 3C, uplink MIMO communications are provided by transmitting using N antennas 44a, 44b, 44c, . . . 44n of the mobile device 42. Additional a first portion of the uplink transmissions are received using M antennas 43a1, 43b1, 43c1, . . . 43m1 of a first base station 41a, while a second portion of the uplink transmissions are received using M antennas 43a2, 43b2, 43c2, . . . 43m2 of a second base station 41b. Additionally, the first base station 41a and the second base station 41b communication with one another over wired, optical, and/or wireless links.

The MIMO scenario of FIG. 3C illustrates an example in which multiple base stations cooperate to facilitate MIMO communications.

With the introduction of the 5G NR air interface standards, 3GPP has allowed for the simultaneous operation of 5G and 4G standards in order to facilitate the transition. This mode can be referred to as Non-Stand-Alone (NSA) operation or E-UTRAN New Radio-Dual Connectivity (EN-DC) and involves both 4G and 5G carriers being simultaneously transmitted from user equipment (UE).

In certain EN-DC applications, dual connectivity NSA involves overlaying 5G systems onto an existing 4G core network. For dual connectivity in such applications, the control and synchronization between the base station and the UE can be performed by the 4G network while the 5G network is a complementary radio access network tethered to the 4G anchor. The 4G anchor can connect to the existing 4G network with the overlay of 5G data/control.

Figure 4:
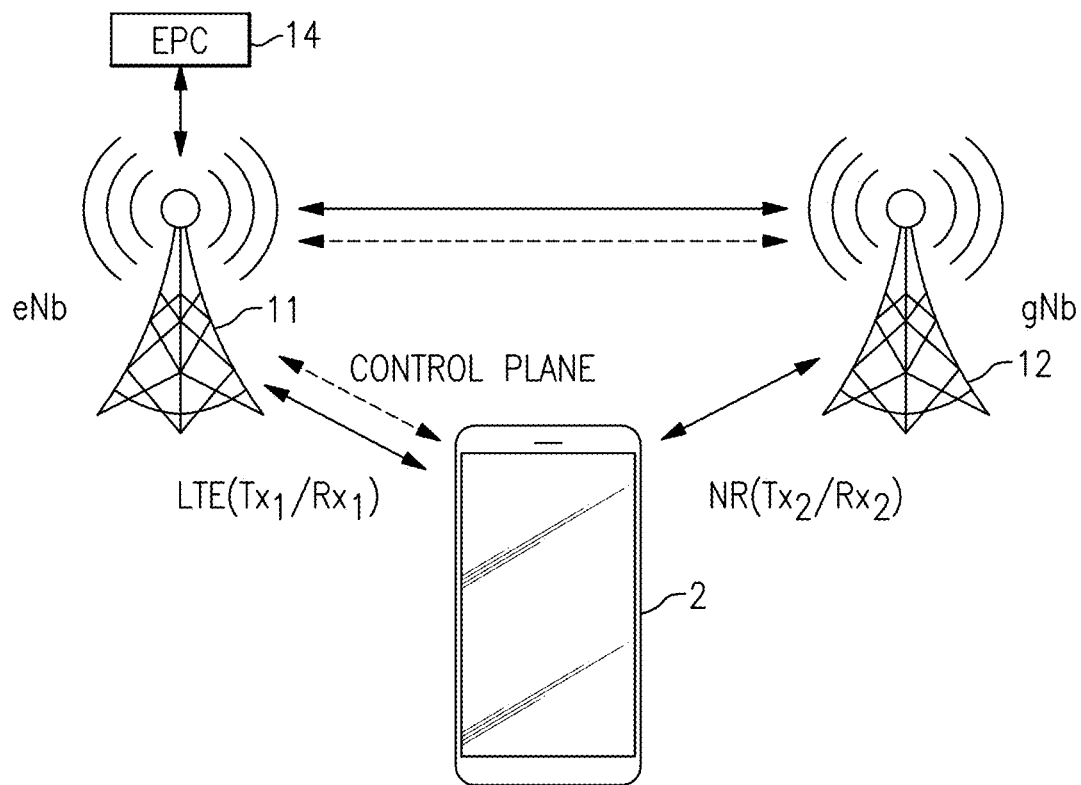
FIG. 4 is a schematic diagram of an example dual connectivity network topology.

FIG. 4 is a schematic diagram of an example dual connectivity network topology. This architecture can leverage LTE legacy coverage to ensure continuity of service delivery and the progressive rollout of 5G cells. A UE 2 can simultaneously transmit dual uplink LTE and NR carrier. The UE 2 can transmit an uplink LTE carrier Tx1 to the eNB 11 while transmitting an uplink NR carrier Tx2 to the gNB 12 to implement dual connectivity. Any suitable combination of uplink carriers Tx1, Tx2 and/or downlink carriers Rx1, Rx2 can be concurrently transmitted via wireless links in the example network topology of FIG. 1. The eNB 11 can provide a connection with a core network, such as an Evolved Packet Core (EPC) 14. The gNB 12 can communicate with the core network via the eNB 11. Control plane data can be wireless communicated between the UE 2 and eNB 11. The eNB 11 can also communicate control plane data with the gNB 12. Control plane data can propagate along the paths of the dashed lines in FIG. 4. The solid lines in FIG. 4 are for data plane paths.

In the example dual connectivity topology of FIG. 4, any suitable combinations of standardized bands and radio access technologies (e.g., FDD, TDD, SUL, SDL) can be wirelessly transmitted and received. This can present technical challenges related to having multiple separate radios and bands functioning in the UE 2. With a TDD LTE anchor point, network operation may be synchronous, in which case the operating modes can be constrained to Tx1/Tx2 and Rx1/Rx2, or asynchronous which can involve Tx1/Tx2, Tx1/Rx2, Rx1/Tx2, Rx1/Rx2. When the LTE anchor is a frequency division duplex (FDD) carrier, the TDD/FDD inter-band operation can involve simultaneous Tx1/Rx1/Tx2 and Tx1/Rx1/Rx2.

As discussed above, EN-DC can involve both 4G and 5G carriers being simultaneously transmitted from a UE. Transmitting both 4G and 5G carriers in a UE, such as a phone, typically involves two power amplifiers (PAs) being active at the same time. Traditionally, having two power amplifiers active simultaneously would involve the placement of one or more additional power amplifiers specifically suited for EN-DC operation. Additional board space and expense is incurred when designing to support such EN-DC/NSA operation.

Examples of Features Supported by RFFE Systems Including Power Amplifiers

A radio frequency (RF) communication device can include multiple antennas for supporting wireless communications. Additionally, the RF communication device can include a radio frequency front-end (RFFE) system for processing signals received from and transmitted by the antennas. The RFFE system can provide a number of functions, including, but not limited to, signal filtering, signal partitioning and combining, controlling component connectivity to the antennas, and/or signal amplification.

RFFE systems can be used to handle RF signals of a wide variety of types, including, but not limited to, wireless local area network (WLAN) signals, Bluetooth signals, and/or cellular signals. RFFE systems are also referred to herein as front-end systems.

RFFE systems can be used to process signals of a wide range of frequencies. For example, certain RFFE systems can operate using one or more low bands (for example, RF signal bands having a frequency content of 1 GHz or less, also referred to herein as LB), one or more mid bands (for example, RF signal bands having a frequency content between 1 GHz and 2.3 GHz, also referred to herein as MB), one or more high bands (for example, RF signal bands having a frequency content between 2.3 GHz and 3 GHz, also referred to herein as HB), and one or more ultrahigh bands (for example, RF signal bands having a frequency content between 3 GHz and 7.125 GHz, also referred to herein as UHB). In certain implementations, modules operate over mid band and high band frequencies (MHB).

Moreover, RFFE systems can also process millimeter wave frequency signals, such as those in FR2 of 5G.

RFFE systems can be used in a wide variety of RF communication devices, including, but not limited to, smartphones, base stations, laptops, handsets, wearable electronics, and/or tablets.

An RFFE system can be implemented to support a variety of features that enhance bandwidth and/or other performance characteristics of the RF communication device in which the RFFE system is incorporated.

For example, to support wider bandwidth, an increasing number of uplink carrier aggregation scenarios have been developed to support wider bandwidth. Additionally, the bandwidths for uplink and downlink cannot be arbitrarily sent since there is a minimum uplink bandwidth for maintaining a reliable link supported by the transport layer's ACK/NACK traffic. Thus, in 4G/5G, wideband uplink carrier aggregation should be supported to achieve higher bandwidth for downlink carrier aggregation.

Thus, an RFFE system can be implemented to support both uplink and downlink carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels, for instance up to five carriers. Carrier aggregation includes contiguous aggregation, in which contiguous carriers within the same operating frequency band are aggregated. Carrier aggregation can also be non-contiguous, and can include carriers separated in frequency within a common band or in different bands.

Transition from 4G to 5G is through non-standalone (NSA) operation, rather than directly to full standalone (SA) operation. Current networks operate in 4G and 5G concurrently by communicating with an eNodeB and a gNodeB simultaneously in an EN-DC mode of operation. Thus, 4G and 5G transmitters operate concurrently is such a phone.

To provide such feature support, an RFFE system can be implemented to support EN-DC.

Support for EN-DC can cover a wide range of frequency bands, including using a 4G band in the LB, MHB, HB, or UHB frequency ranges in combination with a 5G band in the LB, MHB, HB, or UHB frequency ranges. Thus, various combinations of EN-DC including, but not limited to, LB- LB EN-DC, MHB-MHB EN-DC, LB-MHB EN-DC, LB-UHB EN-DC, MHB-UHB EN-DC, and UHB-UHB EN-DC, are possible.

Moreover, in certain dual uplink transmission scenarios, it can be desirable to provide flexibility between swapping which antenna transmits a first RF transmit signal (for instance, one of a 4G signal or a 5G signal) on a first side of a phone board assembly and which antenna transmits a second RF transmit signal (for instance, the other of the 4G signal or the 5G signal) on a side of the phone board assembly. To provide such flexibility, an RFFE system can support a transmit swap function to selectively switch which antenna a particular RF transmit signal is transmitted from.

Another technique for increasing uplink capacity is uplink multiple-input multiple-output (MIMO) communications, in which multiple (for instance, two) power amplifiers transmit two different signals simultaneously on the same frequency using different antennas. MIMO communications benefit from higher signal to noise ratio, improved coding, and/or reduced signal interference due to spatial multiplexing differences of the radio environment. MIMO order refers to a number of separate data streams sent or received.

Broadband Power Amplifiers

As wireless communication systems evolve, more and more frequency bands are integrated into a single RF front-end module and with a shared or common power amplifier used to provide amplification to RF signals associated with multiple frequency bands. For example, in certain applications only one power amplifier is employed.

Power amplifier architectures like push-pull amplifiers, Doherty amplifiers, or a combination of both (Doherty push-pull) can be used for power amplification in multi-band applications.

Accordingly, it is important to have an efficient wideband matching network for the power amplifier to cover a wide range of frequencies. However, it is difficult to design such a wideband matching network, since there are many frequency bands and the fractional bandwidth is large. For instance, low band (LB) from B71 to B8 has a fractional bandwidth of about 32%.

Moreover, different frequency bands have different input impedance from duplexers, which makes it even more challenging to design suitable matching networks.

For push-pull and Doherty push-pull power amplifiers, the output matching network is even more complex and challenging to design. For example, such power amplifiers have design considerations related to harmonic impedance that exacerbate the complexity of the design.

Power amplifiers with broadband matching networks are disclosed herein. In certain embodiments, a power amplifier system includes a power amplifier including one or more power amplifier stages that amplify an RF input signal to generate an RF output signal that is provided to a band selection switch. The band selection switch can be used for providing the RF output signal to a particular band filter of a bank of band filters. The power amplifier stages are formed on a compound semiconductor die (for example, a heterojunction bipolar transistor or HBT die such as a GaAs or GaN die), and the band switch is formed on a silicon switch die (for example, a silicon-on-insulator or SOI die). Additionally, the compound semiconductor die and the silicon switch die each include at least one controllable impedance for providing bandwidth adjustment to the power amplifier.

Accordingly, impedance control (for example, load-line switching) on both the compound semiconductor die and the silicon switch die are used for adjusting the power amplifier's load line to provide bandwidth enhancement.

Moreover, providing switchable components on both the compound semiconductor die and the silicon switch die provides a mechanism for effectively controlling harmonic impedances.

The teachings herein are applicable to a wide range of power amplifier architectures including, but not limited to, reconfigurable wideband output matching networks for push-pull and Doherty push-pull power amplifier systems.

Figure 5A:
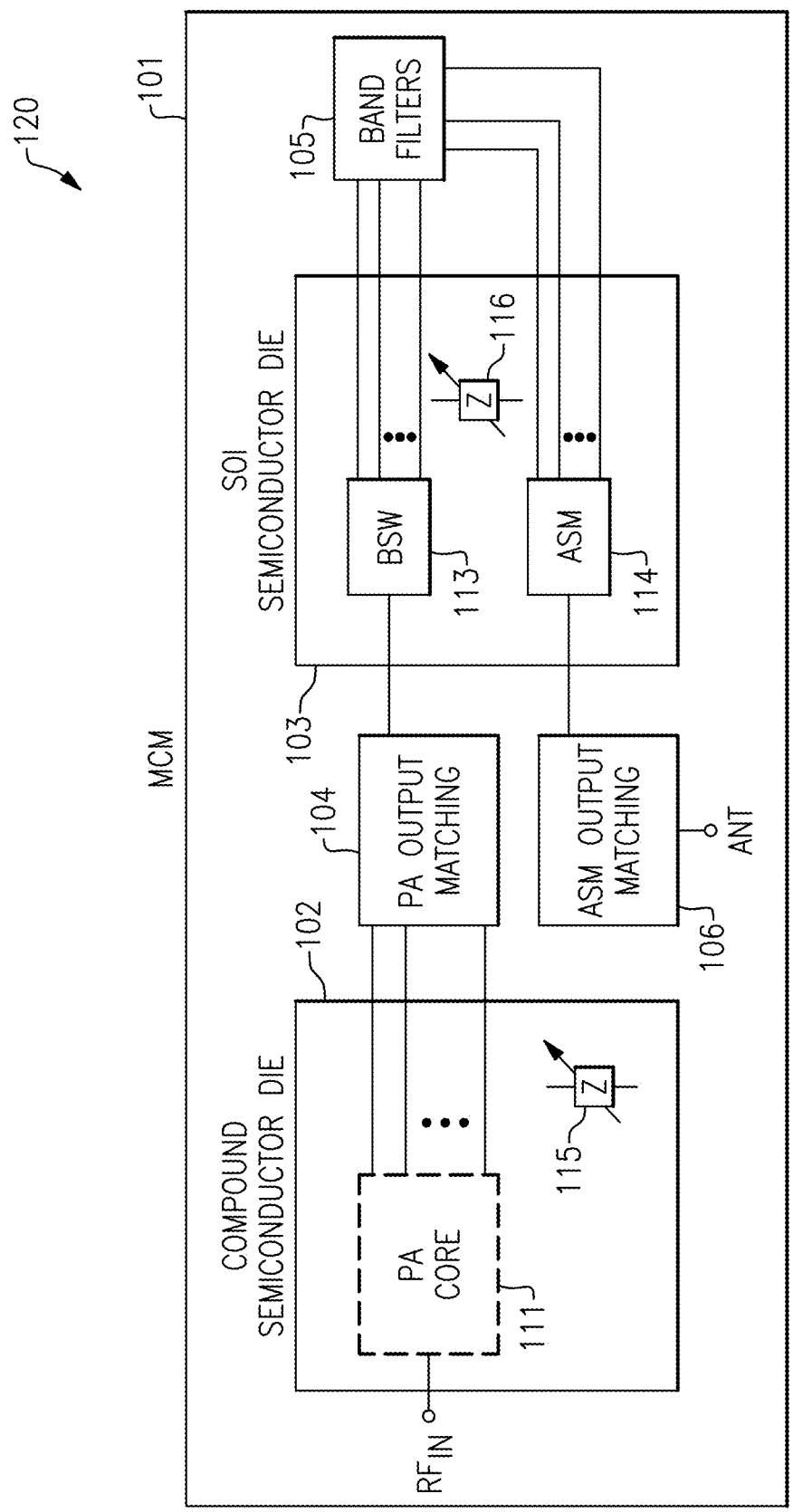
FIG. 5A is a schematic diagram of a broadband power amplifier system according to one embodiment.

FIG. 5A is a schematic diagram of a broadband power amplifier system 120 according to one embodiment. In the illustrated embodiment, the broadband power amplifier system 120 is implemented as a multi-chip module (MCM), and includes a module substrate 101, a compound semiconductor die 102, an SOI semiconductor die 103, a power amplifier (PA) output matching network 104, band filters 105, and an antenna switch module (ASM) output matching network 106.

As shown in FIG. 5A, the compound semiconductor die 102, the SOI semiconductor die 103, the power amplifier output matching network 104, the band filters 105, and the ASM output matching network 106 are each attached to the module substrate 101. Additionally, the compound semiconductor die 102 includes a power amplifier core 111 including one or more power amplifier stages for providing amplification to an RF input signal $RF_{IN}$. The power amplifier core 111 provides one or more amplified RF signals to the power amplifier matching network 104, which can provide matching (and in some implementations, combining and/or other functions) to generate an RF output signal.

With continuing reference to FIG. 5A, the SOI semiconductor die 103 includes a band switch (BSW) 113 and an ASM 114 formed thereon. The BSW 113 provides the RF output signal to a desired one of the band filters 105 for filtering, and thereafter the filtered RF output signal is provided the ASM 114. The ASM 114 routes the filtered RF output signal to an antenna terminal ANT (which connects to an antenna) by way of the ASM output matching network 106.

As shown in FIG. 5A, the compound semiconductor die 102 includes a first controllable impedance 115, and the SOI semiconductor die 103 includes a second controllable impedance 116. Both the first controllable impedance 115 and the second controllable impedance 116 provide load line adjustment to the power amplifier core 111 to thereby provide bandwidth adjustment.

By implementing the power amplifier system 120 in this manner, operation over wide bandwidth can be achieved. For example, the RF input signal $RF_{IN}$ can correspond to an RF signal associated with various frequency bands covering a wide frequency range. In certain implementations, the RF input signal $RF_{IN}$ is selected from amongst multiple RF input signals each associated with a different frequency band.

Figure 5B:
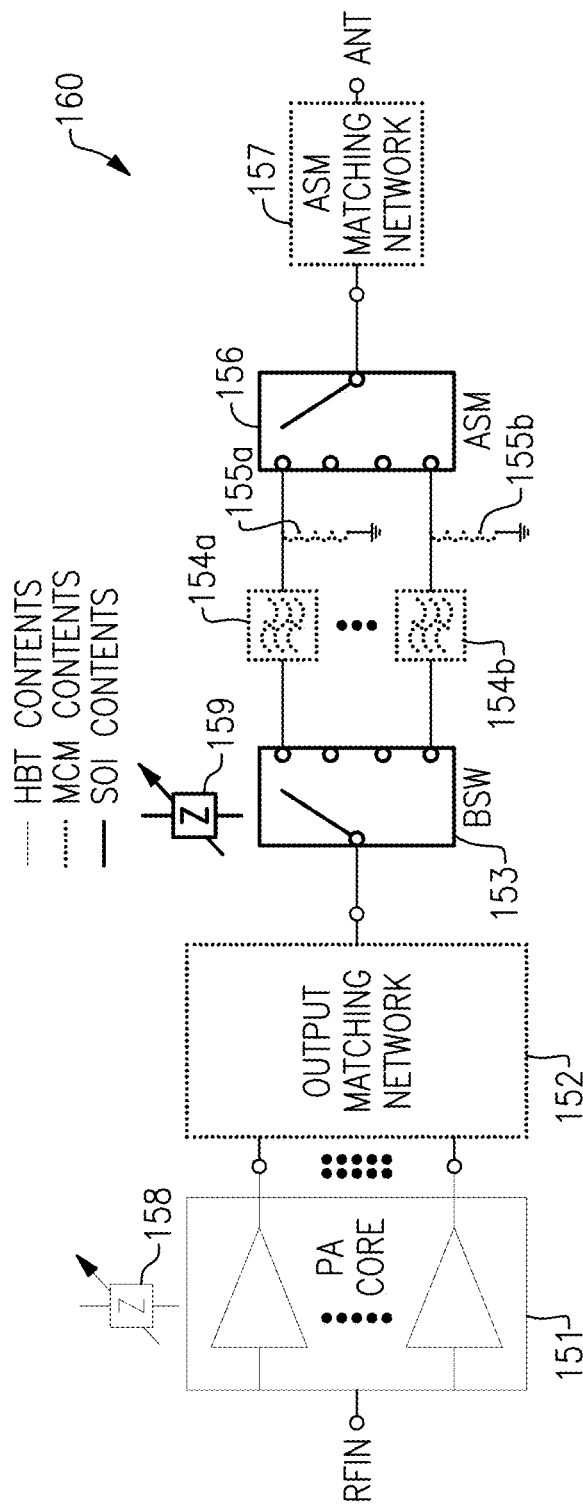
FIG. 5B is a schematic diagram of a broadband power amplifier system according to another embodiment.

FIG. 5B is a schematic diagram of a broadband power amplifier system 160 according to another embodiment. The broadband power amplifier system 160 is implemented as an MCM, and includes a module substrate, an HBT die attached to the module substrate, and an SOI die attached to the module substrate. For clarity of the figure, the MCM substrate, the HBT die, and the SOI die are not explicitly shown, but rather the correspondence of the depicted components to the MCM substrate, the HBT die, and the SOI die are indicated by line pattern and will be discussed below.

The broadband power amplifier system 160 includes a power amplifier core 151 (amplifying an RF input signal RFIN and formed on the HBT die), an output matching network 152 (on the MCM substrate), a BSW 153 (formed on the SOI die), a first band filter 154a (on the MCM substrate), a second band filter 154b (on the MCM substrate), a first shunt inductor 155a (on the MCM substrate), a second shunt inductor 155b (on the MCM substrate), an ASM 156 (formed on the SOI die), an ASM matching network 157 (coupled to an antenna terminal ANT and on the MCM substrate), a first controllable impedance 158 (formed on the HBT die), and a second controllable impedance 159 (formed on the SOI die).

Both the first controllable impedance 158 and the second controllable impedance 159 provide load line adjustment to the power amplifier core 151 to thereby provide bandwidth adjustment. By implementing the power amplifier system 160 in this manner, operation over wide bandwidth can be achieved. Moreover, enhanced control over harmonics can be realized.

Figure 6:
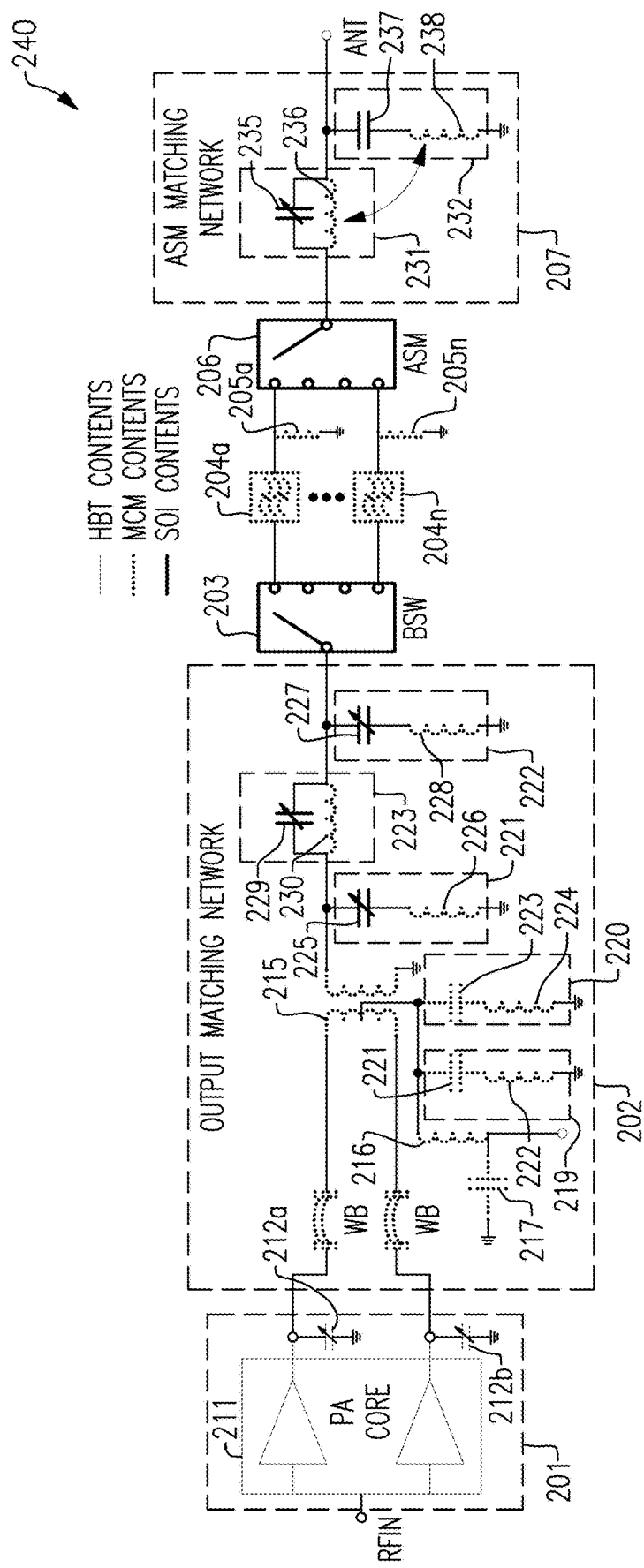
FIG. 6 is a schematic diagram of a broadband power amplifier system according to another embodiment.

FIG. 6 is a schematic diagram of a broadband power amplifier system 240 according to another embodiment. The broadband power amplifier system 240 is implemented as an MCM, and includes a module substrate, an HBT die attached to the module substrate, and an SOI die attached to the module substrate.

The broadband power amplifier system 240 includes a power amplifier 201 that includes a power amplifier core 211 (amplifying an RF input signal RFIN and formed on the HBT die), a first controllable capacitor 212a (formed on the HBT die), and a second controllable capacitor 212b (formed on the HBT die).

The broadband power amplifier system 240 further includes an output matching network 202 that is coupled to the HBT die by wire bonds (WB), in this example. However, flip-chip configurations without wire bonds are also possible. The output matching network 202 includes various components on the MCM substrate such as a balun 215 (including an input side and an output side), an input side choke inductor 216 (connected between a power supply voltage node and a center tap of the input side of the balun 215), an input side decoupling capacitor 217 (connected between the power supply voltage node and ground), a first input side termination network 219 (including a capacitor 221 and an inductor 222), and a second input side termination network 220 (including a capacitor 223 and an inductor 224). The output matching network 202 includes a mix of components formed on the SOI die and on the MCM. For example, the output matching network 202 includes a first shunt output matching network 221 (including inductor 226 on the MCM substrate and controllable capacitor 225 formed on the SOI die), a second shunt output matching network 222 (including inductor 228 on the MCM substrate and controllable capacitor 227 formed on the SOI die), and a series output matching network 223 (including inductor 230 on the MCM substrate and controllable capacitor 229 formed on the SOI die).

The broadband power amplifier system 240 further includes a BSW 203 (formed on the SOI die), band filters 204a . . . 204n (on the MCM substrate), shunt band filter inductors 205a . . . 205n (on the MCM substrate), an ASM 206 (formed on the SOI die), and an ASM matching network 207. The ASM matching network 207 includes a series ASM matching network 231 including an inductor 236 (on the MCM substrate) and a controllable capacitor 235 (formed on the SOI die). The ASM matching network 207 further includes a shunt ASM matching network 232 including an inductor 238 (magnetically coupled to the inductor 236 as denoted by the bidirectional arrow) and a capacitor 237 (formed on the SOI die and coupled to the antenna terminal ANT).

In the illustrated embodiment, the controllable capacitors 212a/212a are formed on the HBT die and provide load line adjustment to the power amplifier core 211 to thereby provide bandwidth adjustment. Additionally, the controllable capacitors 225/227/229 are formed on the SOI die and provide load line adjustment to the power amplifier core 211. By implementing the power amplifier system 240 in this manner, operation over wide bandwidth can be achieved. Moreover, enhanced control over harmonics can be realized.

Figure 7:
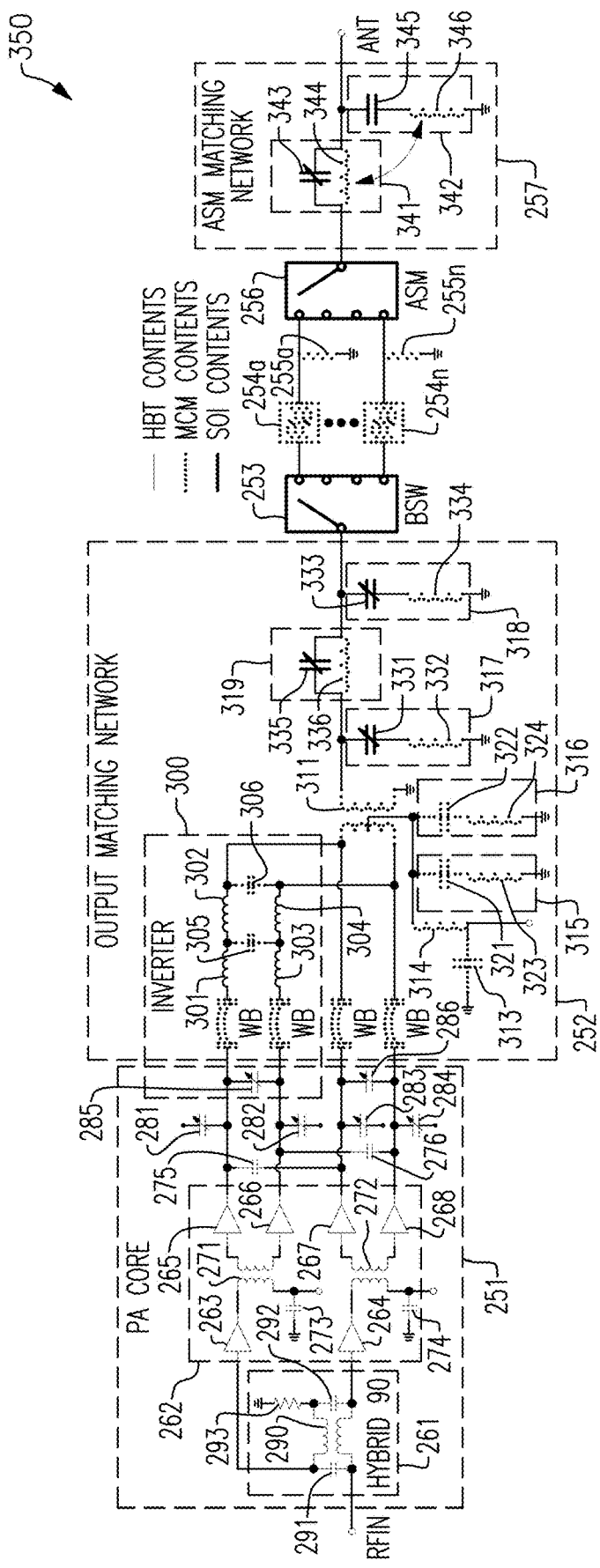
FIG. 7 is a schematic diagram of a broadband power amplifier system according to another embodiment.

FIG. 7 is a schematic diagram of a broadband power amplifier system 350 according to another embodiment. The broadband power amplifier system 350 is implemented as an MCM, and includes a module substrate, an HBT die attached to the module substrate, and an SOI die attached to the module substrate.

The broadband power amplifier system 350 includes a power amplifier 251 formed on an HBT die and including an input hybrid coupler 261 (receiving an RF input signal RFIN), a power amplifier core 262, a first cross capacitor 275, a second cross capacitor 276, a first controllable shunt capacitor 281, a second controllable shunt capacitor 282, a third controllable shunt capacitor 283, a fourth controllable shunt capacitor 284, a first controllable cross capacitor 285, and a second controllable cross capacitor 286. The input hybrid coupler 261 includes a balun 290, a first capacitor 291, a second capacitor 292, and a resistor 293. The power amplifier core 262 includes a first power amplifier input stage 263, a second power amplifier input stage 264, a first power amplifier output stage 265, a second power amplifier output stage 266, a third power amplifier output stage 267, a fourth power amplifier output stage 268, a first balun 271, a second balun 272, a first balun termination capacitor 273, and a second balun termination capacitor 274.

The broadband power amplifier system 350 further includes an output matching network 252 that is coupled to the HBT die by wire bonds (WB). The output matching network 252 includes various components on the MCM substrate such as an inverter 300 (including a first inductor 301, a second inductor 302, a third inductor 303, a fourth inductor 304, a first capacitor 305, and a second capacitor 306), a balun 311 (including an input side and an output side), an input side choke inductor 314 (connected between a power supply voltage node and a center tap of the input side of the balun 311), an input side decoupling capacitor 313 (connected between the power supply voltage node and ground), a first input side termination network 315 (including a capacitor 321 and an inductor 323), and a second input side termination network 316 (including a capacitor 322 and an inductor 324). The output matching network 252 is implemented with a mix of components formed on the SOI die and on the MCM. For example, the output matching network 252 includes a first shunt output matching network 317 (including inductor 332 on the MCM substrate and controllable capacitor 331 formed on the SOI die), a second shunt output matching network 318 (including inductor 334 on the MCM substrate and controllable capacitor 333 formed on the SOI die), and a series output matching network 319 (including inductor 336 on the MCM substrate and controllable capacitor 335 formed on the SOI die).

The broadband power amplifier system 350 further includes a BSW 253 (formed on the SOI die), band filters 254a . . . 254n (on the MCM substrate), shunt band filter inductors 255a . . . 255n (on the MCM substrate), an ASM 256 (formed on the SOI die), and an ASM matching network 257. The ASM matching network 257 includes a series ASM matching network 341 including an inductor 344 (on the MCM substrate) and a controllable capacitor 343 (formed on the SOI die). The ASM matching network 257 further includes a shunt ASM matching network 342 including an inductor 346 (magnetically coupled to the inductor 344) and a capacitor 345 (formed on the SOI die and coupled to the antenna terminal ANT).

In the illustrated embodiment, the controllable capacitors 281-286 are formed on the HBT die and provide load line adjustment to the power amplifier core 262 to thereby provide bandwidth adjustment. Additionally, the controllable capacitors 331/333/335 are formed on the SOI die and provide load line adjustment to the power amplifier core 262. By implementing the power amplifier system 350 in this manner, operation over wide bandwidth can be achieved. Moreover, enhanced control over harmonics can be realized.

The controllable capacitors 281-284 serve to provide control to capacitances used for class E operation. Additionally, the controllable capacitors 285/286 control performance of the inverter 300. Furthermore, the controllable capacitors 331/333/335 serve as post-balun matching capacitors.

Furthermore, the controllable capacitor 343 is tunable for harmonic rejections at second harmonic and third harmonic frequencies.

With continuing reference to FIG. 7B, the cross capacitors 275/276 operate in combination with the first input side termination network 315 (which can be tuned to a second harmonic frequency) to provide second harmonic termination and to provide common-mode rejection. Furthermore, the second input side termination network 316 (which can be tuned to a fundamental frequency) can provide fundamental termination and to control balance of the balun 311.

In certain implementations, the inductor 332 and the inductor 334 can have small inductance values or replaced with a short to ground.

Although performance enhancements provided by certain components were discussed in the context of FIG. 7B, similar components of FIG. 7A can likewise provide such benefits. Furthermore, certain components are depicted as tunable or fixed in FIGS. 6 and 7, other combinations of tunable and fixed components are possible. For example, components depicted as fixed can be implemented as tunable. Moreover, a portion of the components depicted as tunable can be replaced with fixed components.

As will be discussed in detail further below, the impedance contour looking into the input side of the balun (for example, looking in from the left hand side of the balun 215 of FIG. 6 or the balun 311 of FIG. 7) can be controlled to provide enhanced performance. For example, the impedance contour can be controlled to widen the amount of bandwidth enhancement realized by the power amplifier.

Figure 8A:
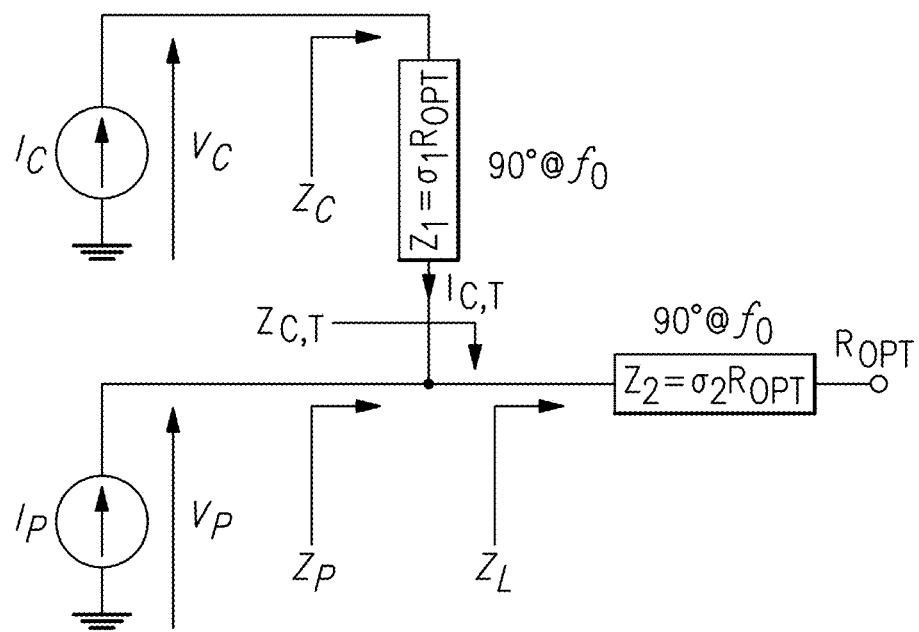
FIG. 8A is a schematic diagram of one embodiment an impedance transformation network for a Doherty amplifier.
Figure 8B:
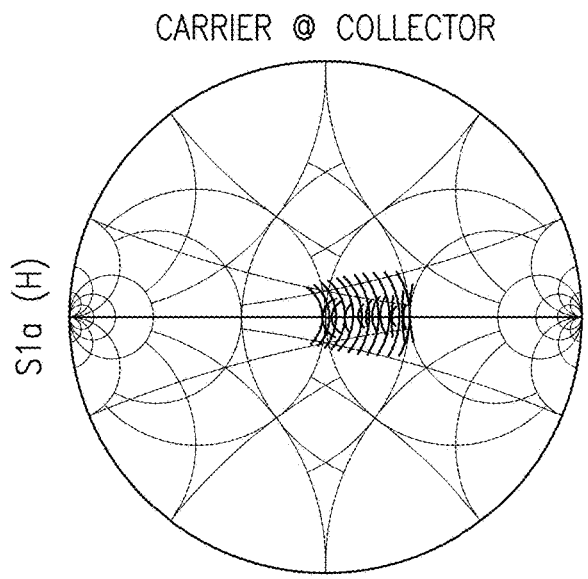
FIG. 8B is one example of a Smith chart depicting carrier amplifier impedance at the collector for a Doherty amplifier.
Figure 8C:
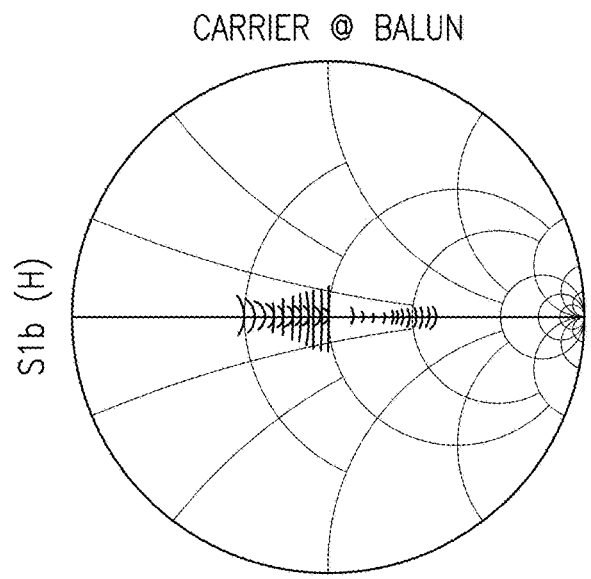
FIG. 8C is one example of a Smith chart depicting carrier amplifier impedance at the balun for a Doherty amplifier.
Figure 8D:
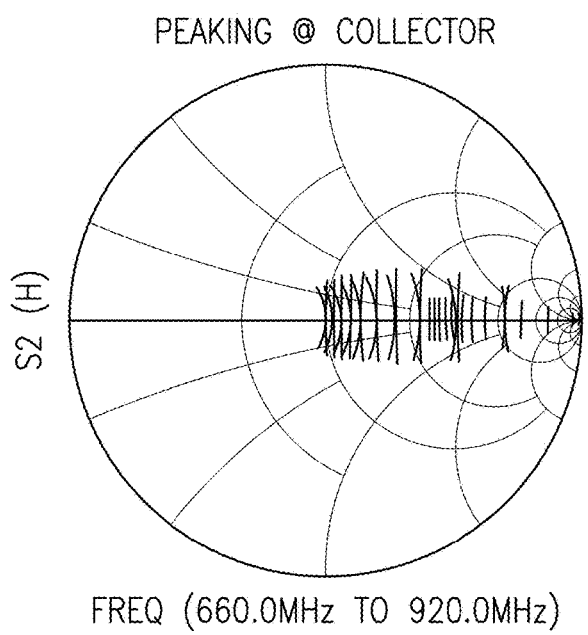
FIG. 8D is one example of a Smith chart depicting peaking amplifier impedance at the collector for a Doherty amplifier.
Figure 8E:
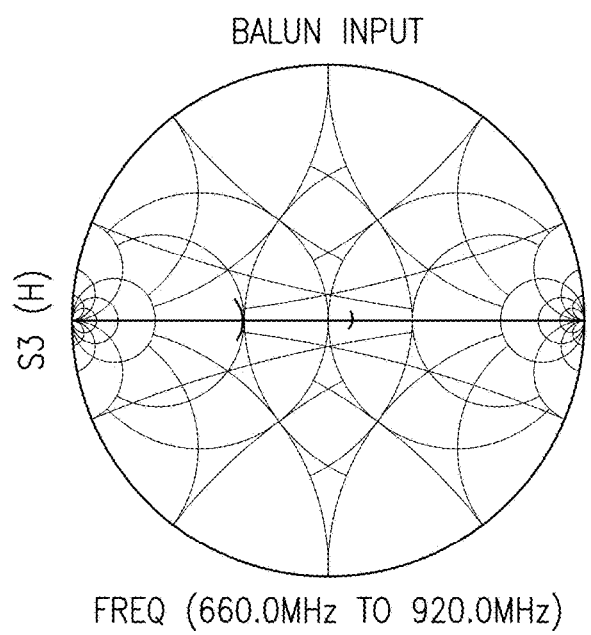
FIG. 8E is one example of a Smith chart depicting balun input impedance for a Doherty amplifier.

FIG. 8A is a schematic diagram of one embodiment an impedance transformation network for a Doherty amplifier that is implemented with bipolar transistors. FIG. 8B is one example of a Smith chart depicting carrier amplifier impedance at the collector for a Doherty amplifier. FIG. 8C is one example of a Smith chart depicting carrier amplifier impedance at the balun for a Doherty amplifier. FIG. 8D is one example of a Smith chart depicting peaking amplifier impedance at the collector for a Doherty amplifier. FIG. 8E is one example of a Smith chart depicting balun input impedance for a Doherty amplifier.

The impedance transformation network includes a carrier current source $I_C$ (representing a carrier stage of the Doherty amplifier providing signal $V_C$ and presented with output impedance $Z_C$), a peaking current source $I_P$ (representing a peaking stage of the Doherty amplifier providing signal $V_P$ and presented with output impedance $Z_P$), a first impedance $Z_1$ (having value $\sigma_1 R_{OPT}$ and providing a phase shift of about 90° at the fundamental frequency $f_0$ of the RF signal amplified by the Doherty amplifier), and a second impedance $Z_2$ (having value $\sigma_2 R_{OPT}$ and providing a phase shift of about 90° at the fundamental frequency $f_0$). A current from the first impedance $Z_1$ is annotated as $I_{C,T}$ and the first impedance $Z_1$ is presented with an output impedance $Z_{C,T}$. Additionally, a load impedance $Z_L$ into the second impedance $Z_2$ is annotated in FIG. 8A.

With reference to FIGS. 8A to 8E, values of $\sigma_1$ and $\sigma_2$ can be chosen by the solution of Equation 1 or the solution of Equation 2 shown below, where a can be, for example, about 0.5 for good performance at 6 dB back off power.

$$(\sigma_1, \sigma_2) = (1, \sqrt{\alpha}). \qquad \text{Equation 1}$$

$$(\sigma_1, \sigma_2) = \left( \sqrt{\frac{1 + \sqrt{1/\alpha}}{2\alpha}}, \sqrt{\frac{1 + \sqrt{1/\alpha}}{2}} \right) \qquad \text{Equation 2}$$

However, the maximum bandwidth for $Z_L$ is not optimal for the bandwidth of $Z_C$. The solution of Equation 1 (solution 1) is typically used for design, but the solution of Equation 2 (solution 2) provides better performance at bandwidth for back off. Moreover, the above analysis applies to the differential mode, hence the P side (+ or non-inverting) and N side (− or inverting) of the balun are decoupled, and only one side is shown in the analysis.

In FIGS. 8B to 8E trajectories are shown for constant $Z_L$ (15 ohm), solution 1 (ICmax=IPmax), and solution 2 (IPmax=0.65ICmax). Frequency is swept from 660 MHz to 920 MHz. Note that Solution 2 uses higher power supply voltage ($V_{CC}$) for the peaking stage (for example, about 1.6× of $V_{CC}$ for carrier stage).

Figures 9A, 9B:
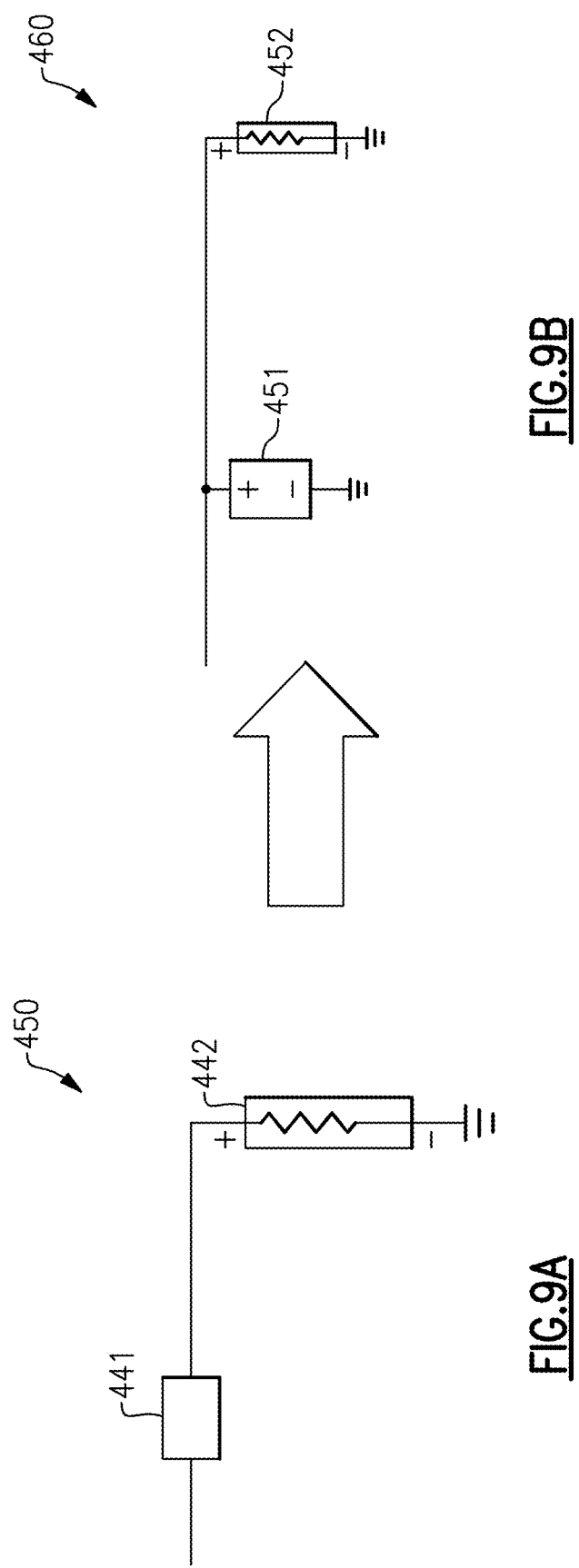
FIG. 9A is a schematic diagram of one embodiment of an impedance network.
FIG. 9B is a schematic diagram of another embodiment of an impedance network.
Figure 9C:
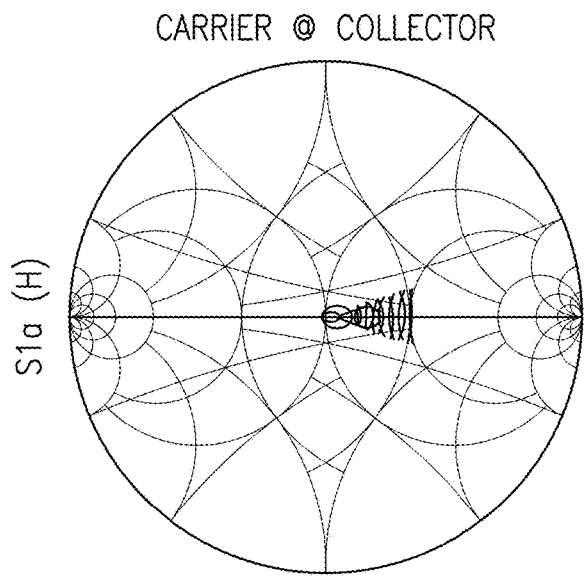
FIG. 9C is another example of a Smith chart depicting carrier amplifier impedance at the collector for a Doherty amplifier.
Figure 9D:
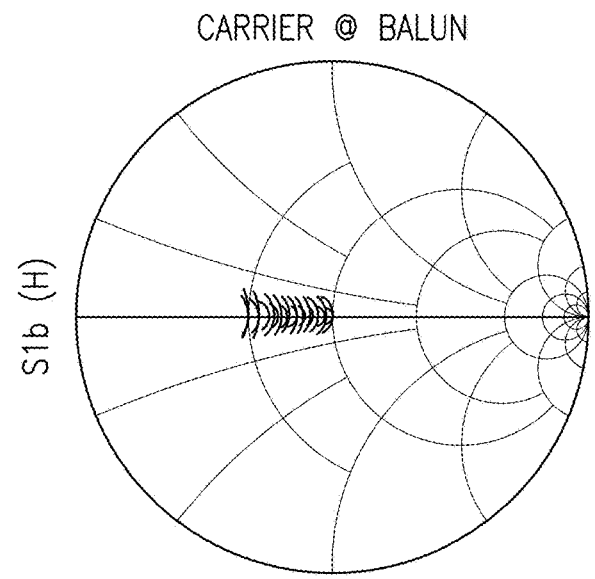
FIG. 9D is another example of a Smith chart depicting carrier amplifier impedance at the balun for a Doherty amplifier.
Figure 9E:
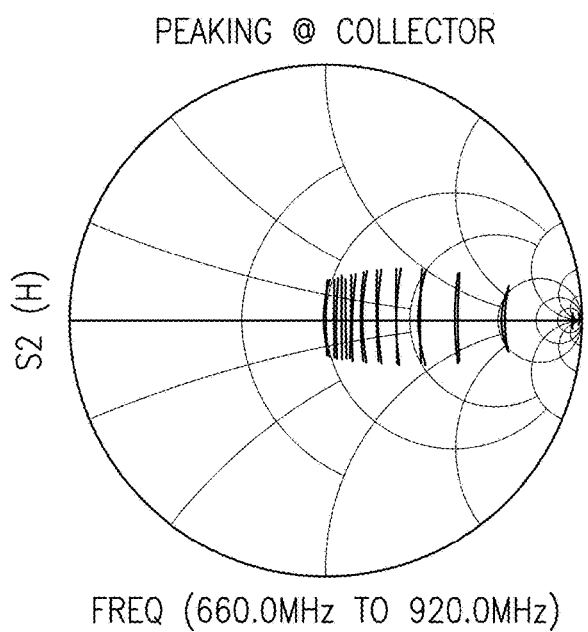
FIG. 9E is another example of a Smith chart depicting peaking amplifier impedance at the collector for a Doherty amplifier.
Figure 9F:
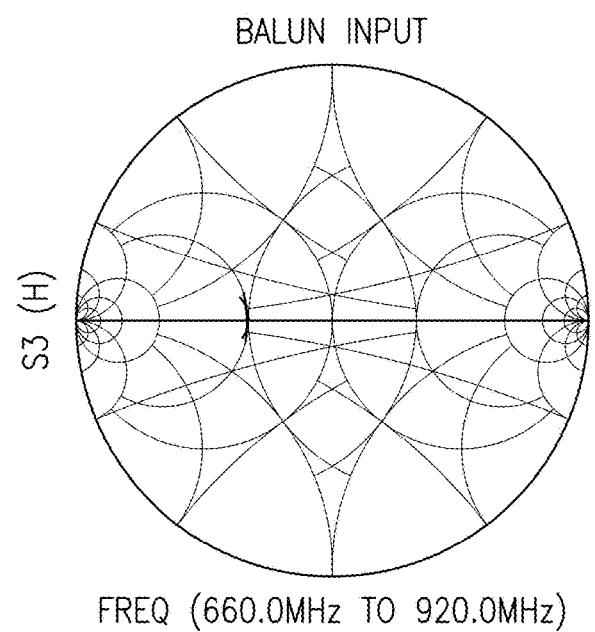
FIG. 9F is another example of a Smith chart depicting balun input impedance for a Doherty amplifier.

FIG. 9A is a schematic diagram of one embodiment of an impedance network 450. FIG. 9B is a schematic diagram of another embodiment of an impedance network 460. FIG. 9C is another example of a Smith chart depicting carrier amplifier impedance at the collector for a Doherty amplifier. FIG. 9D is another example of a Smith chart depicting carrier amplifier impedance at the balun for a Doherty amplifier. FIG. 9E is another example of a Smith chart depicting peaking amplifier impedance at the collector for a Doherty amplifier. FIG. 9F is another example of a Smith chart depicting balun input impedance for a Doherty amplifier.

In the illustrated embodiment, the network 450 includes a first impedance 441 and a second impedance 442. The first impedance 441 has value of about $Z_L/\sqrt{2}$ while the second impedance 442 has value $Z_L 0.5$. Additionally, the network 460 represents a transformation of the network 450 to a shunt capacitor load 451 and an inductive impedance 452 of value $Z_L$.

In this embodiment, the solution 1 is adopted, and the configuration of the network 460 is used. The inventors have recognized that the inverter and balun combined would produce wide bandwidth when the input impedance of the balun poses a contour along the admittance circle. Such a contour can be realized by designing the balun input impedance to be a particular constant inductive load, and then adding a parallel shunt input capacitor to the input of the balun.

Accordingly, in certain embodiments herein, a balun input impedance is designed to be inductive, and a shunt capacitor is placed at the input of the balun. For example, the balun can include an input side including a first input terminal and a second input terminal either or both of which can include a shunt capacitor. This configuration provides wide bandwidth performance.

The plots of FIGS. 9C to 9F represent impedance trajectories for solution 1 with a transmission line, and for solution 1 with a shunt cap model. Frequency is swept from 660 MHz to 920 MHz.

Figures 10A, 10B:
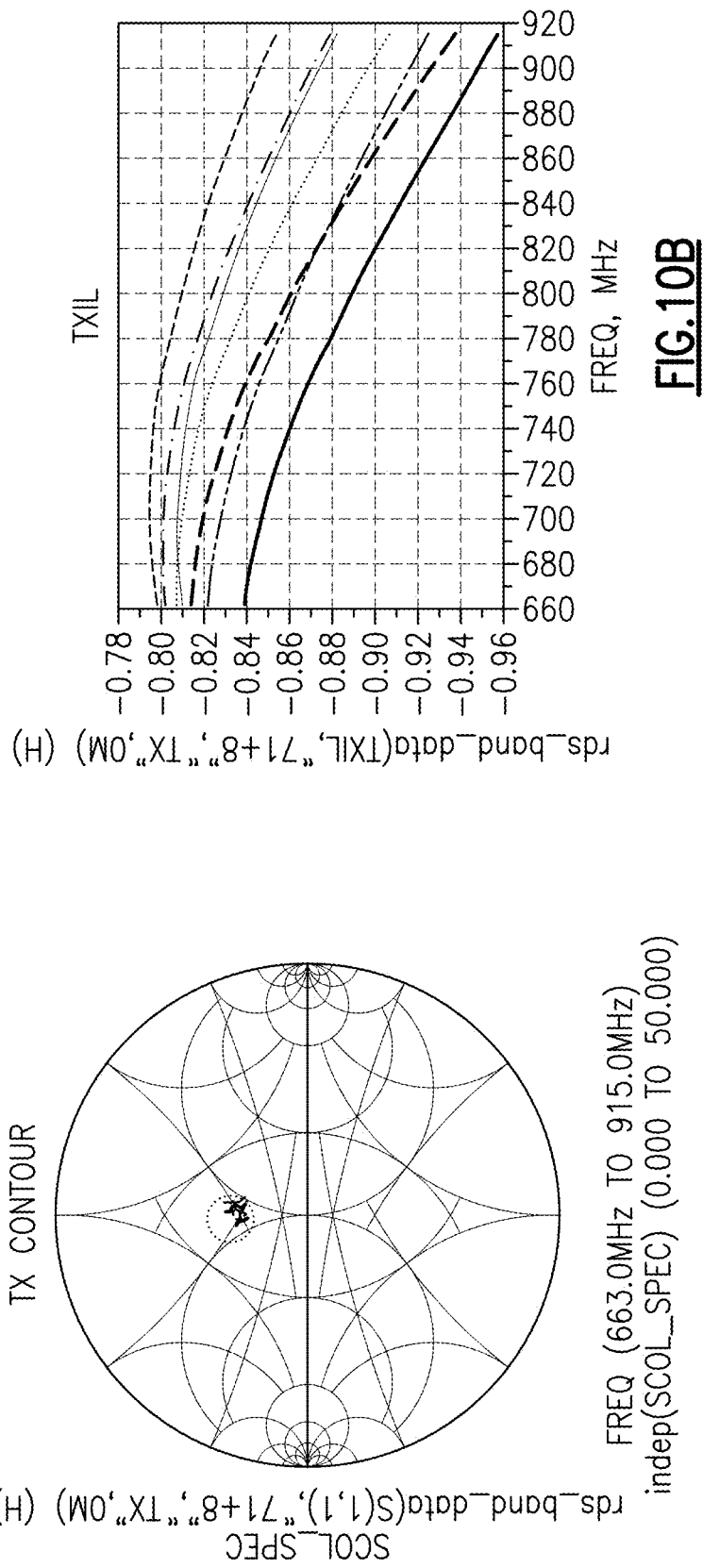
FIG. 10A is one example of a Smith chart of a transmit contour for an output matching network.
FIG. 10B is one example of a graph of insertional loss versus frequency for an output matching network.
Figure 10C:
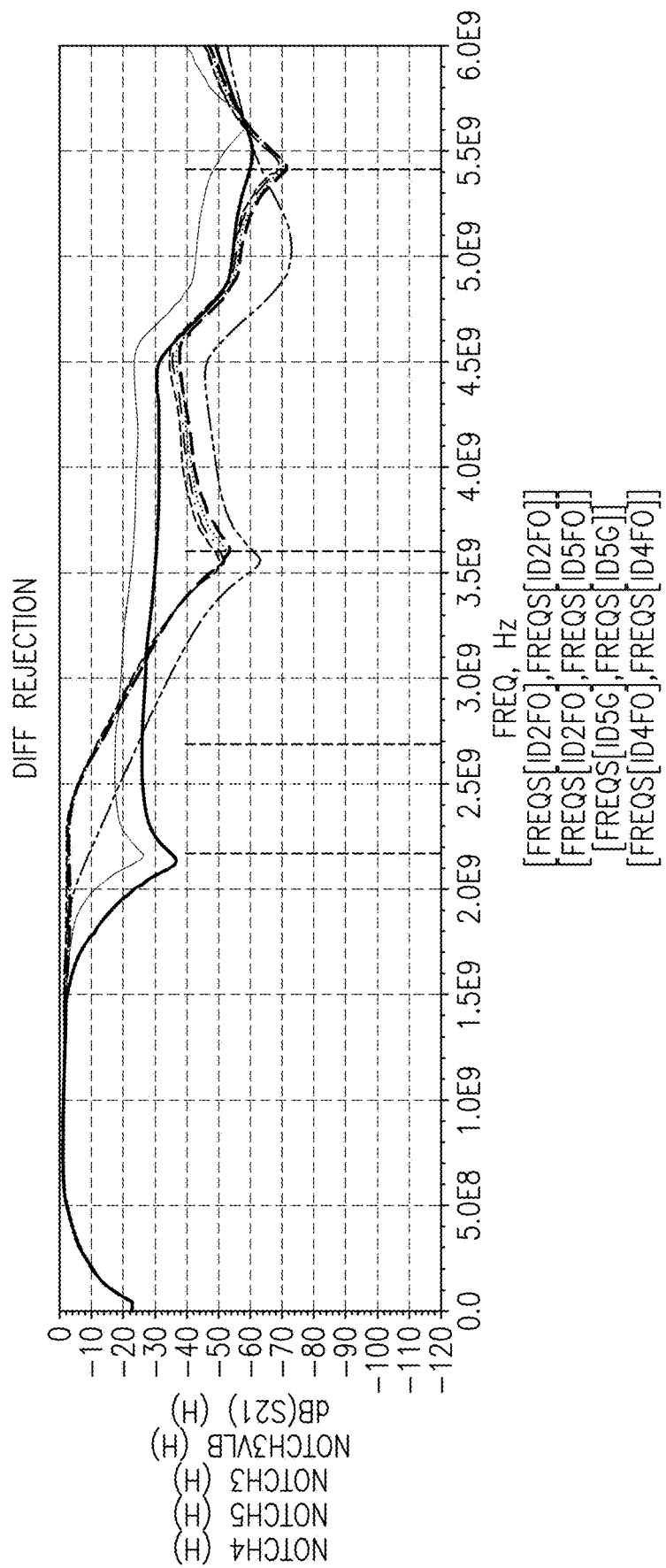
FIG. 10C is one example of a graph of differential rejection versus frequency for an output matching network.
Figure 10D:
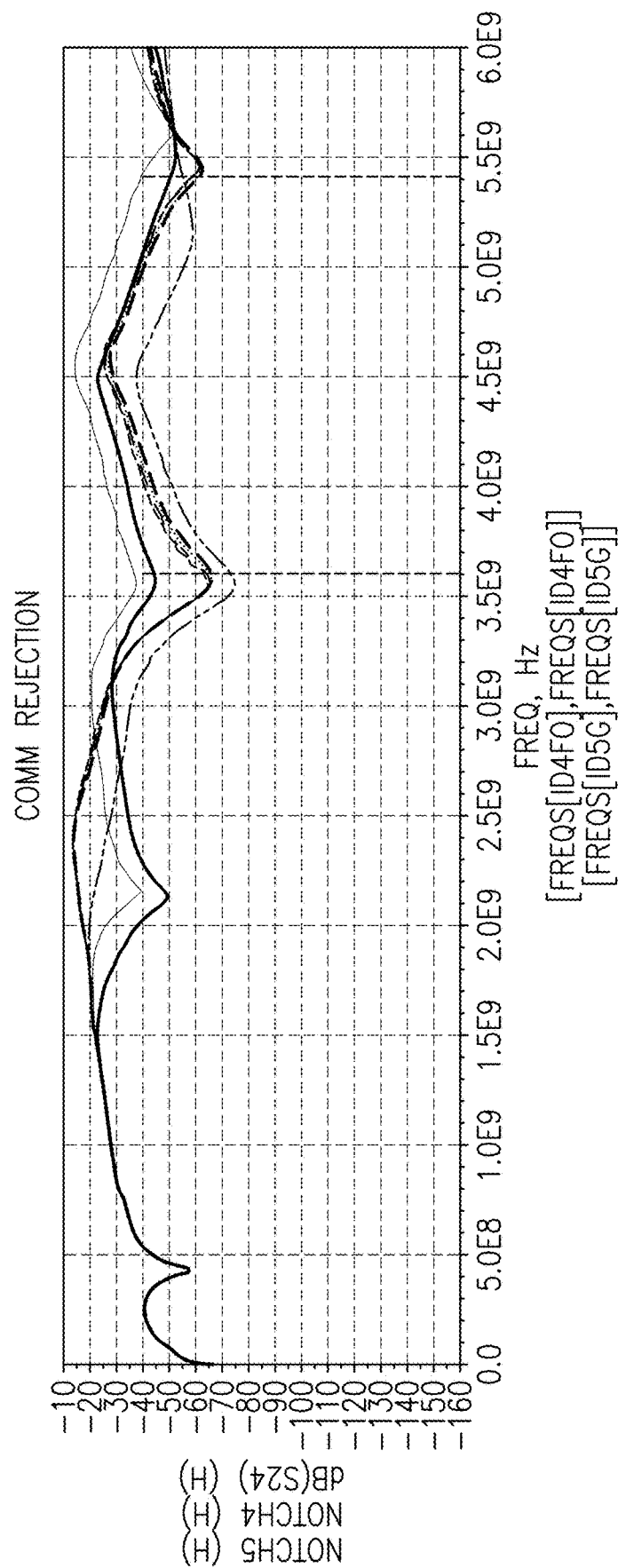
FIG. 10D is one example of a graph of common-mode rejection versus frequency for an output matching network.

FIG. 10A is one example of a Smith chart of a transmit contour for an output matching network. Frequency is swept from 663 MHz to 915 MHz. FIG. 10B is one example of a graph of insertional loss versus frequency for an output matching network. FIG. 10C is one example of a graph of differential rejection versus frequency for an output matching network. FIG. 10D is one example of a graph of common-mode rejection versus frequency for an output matching network.

With reference to FIGS. 10A to 10D, the graphs depict performance simulations for one embodiment of a push-pull power amplifier with a reconfigurable output matching network in accordance with the teachings herein.

Figure 11B:
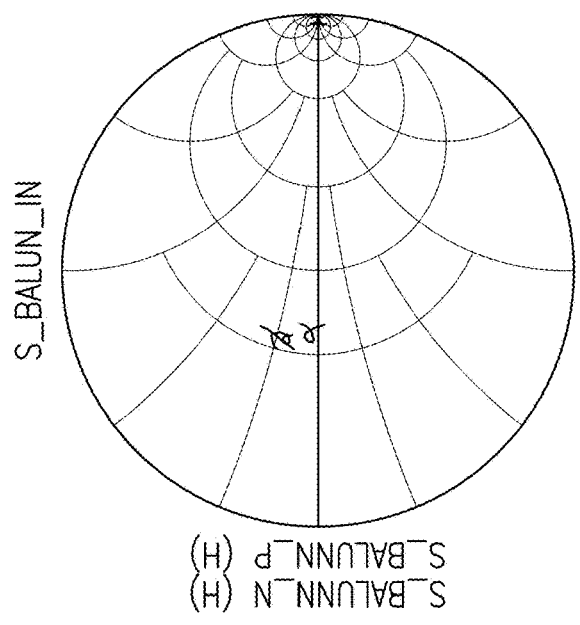
FIG. 11B is a Smith chart of another example of balun input impedance for a Doherty amplifier.
Figure 11C:
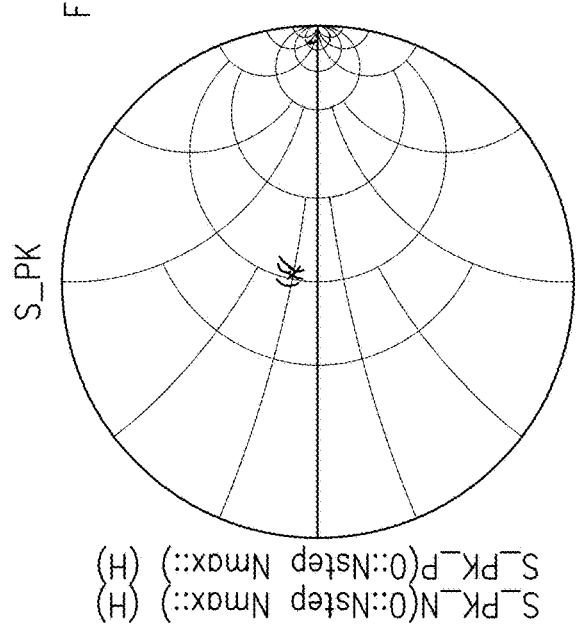
FIG. 11C is a Smith chart of another example of peaking amplifier input impedance for a Doherty amplifier.
Figure 11A:
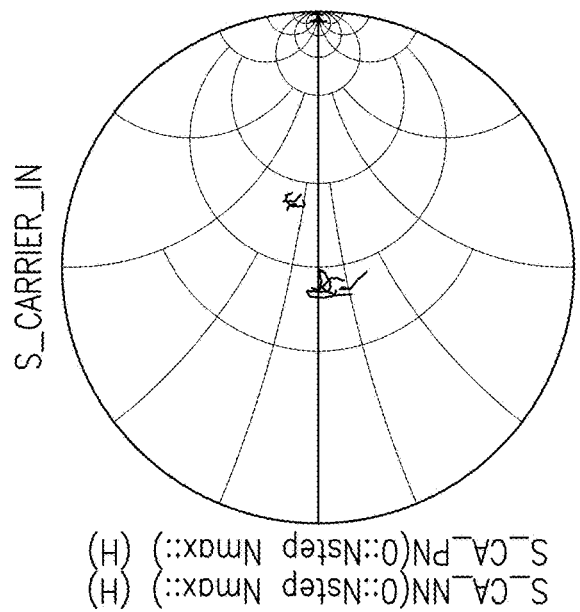
FIG. 11A is a Smith chart of another example of carrier amplifier input impedance for a Doherty amplifier.
Figure 11E:
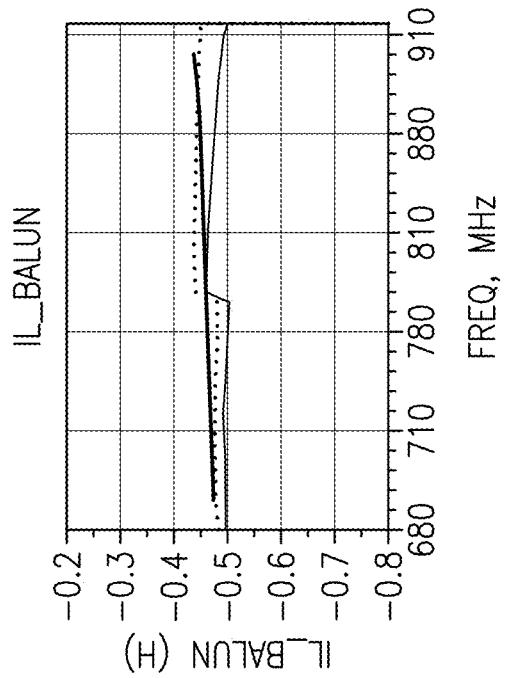
FIG. 11E is one example of a graph of balun insertion loss versus frequency.
Figure 11D:
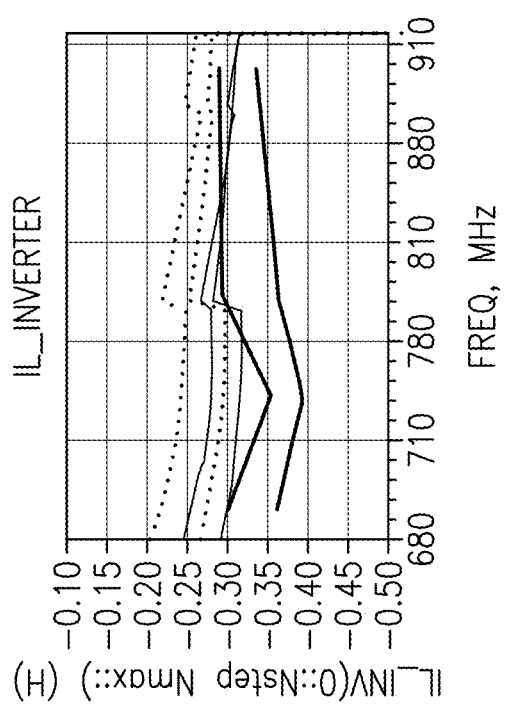
FIG. 11D is one example of a graph of inverter insertion loss versus frequency.
Figure 11F:
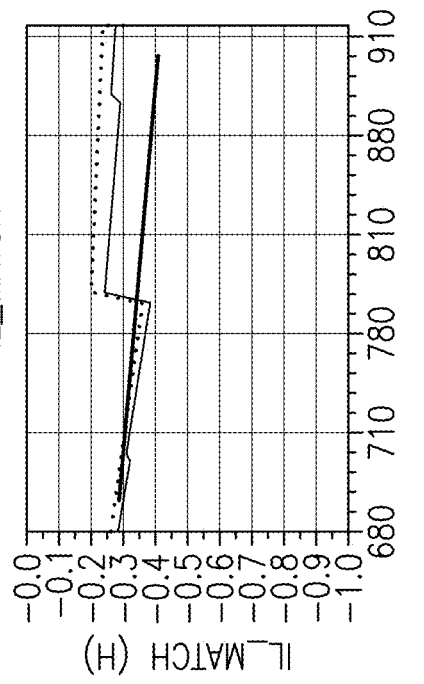
FIG. 11F is one example of a graph of matching network insertion loss versus frequency.

FIG. 11A is a Smith chart of another example of carrier amplifier input impedance for a Doherty amplifier. FIG. 11B is a Smith chart of another example of balun input impedance for a Doherty amplifier. FIG. 11C is a Smith chart of another example of peaking amplifier input impedance for a Doherty amplifier. Frequency is swept from 660 MHz to 915 MHz in FIGS. 11A to 11C. FIG. 11D is one example of a graph of inverter insertion loss versus frequency. FIG. 11E is one example of a graph of balun insertion loss versus frequency. FIG. 11F is one example of a graph of matching network insertion loss versus frequency.

With reference to FIGS. 11A to 11F, the graphs depict performance simulations for one embodiment of a Doherty push-pull power amplifier with a reconfigurable output matching network in accordance with the teachings herein.

Figure 12:
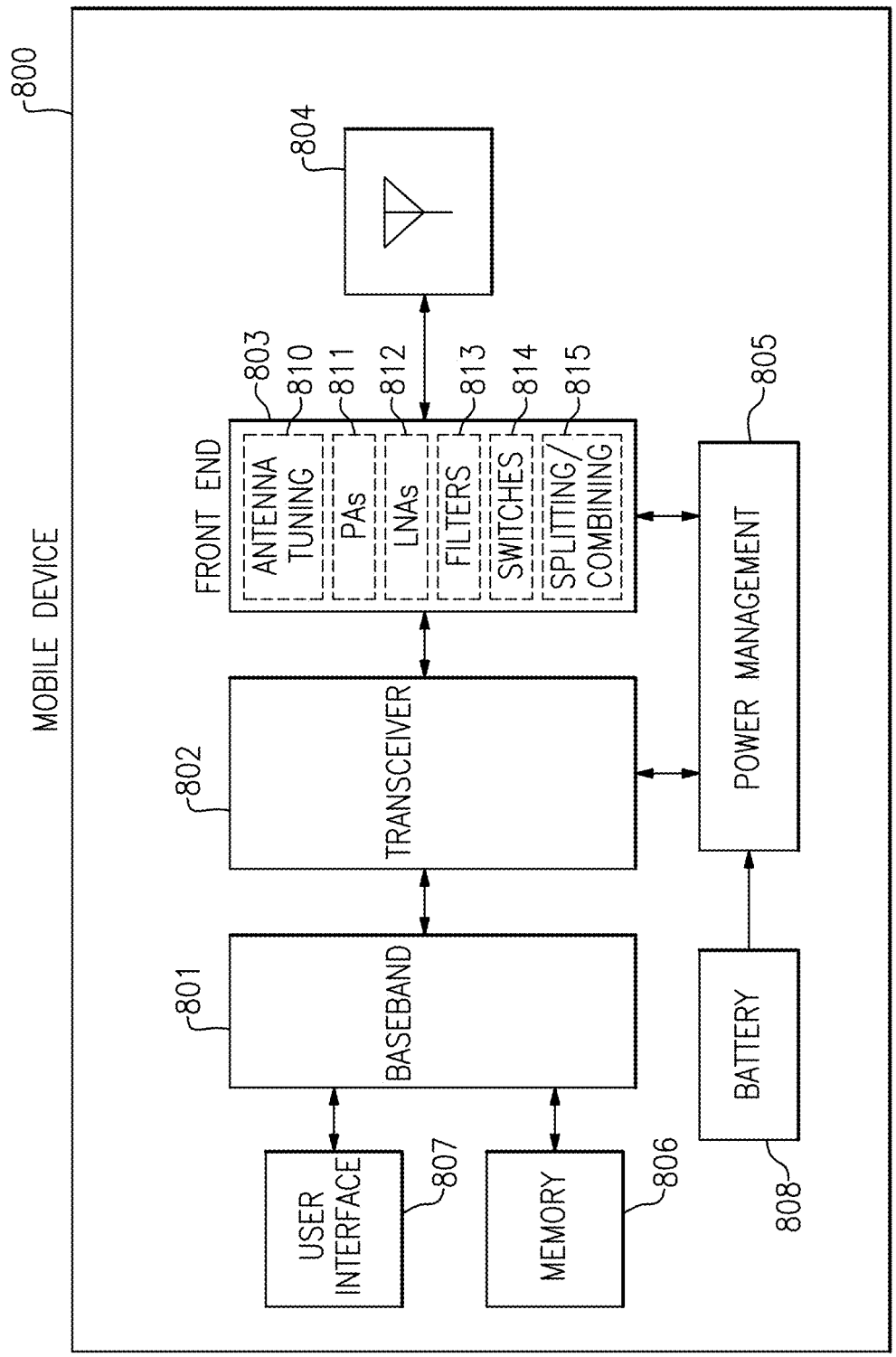
FIG. 12 is a schematic diagram of one embodiment of a mobile device.

FIG. 12 is a schematic diagram of one embodiment of a mobile device 800. The mobile device 800 includes a baseband system 801, a transceiver 802, a front-end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 12 as the transceiver 802. In one example, separate components (for instance, separate circuits or dies) can be provided for handling certain types of RF signals.

The front-end system 803 aids in conditioning signals transmitted to and/or received from the antennas 804. In the illustrated embodiment, the front-end system 803 includes antenna tuning circuitry 810, power amplifiers (PAs) 811, low noise amplifiers (LNAs) 812, filters 813, switches 814, and signal splitting/combining circuitry 815. However, other implementations are possible.

For example, the front-end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front-end system 803 can include amplifiers having controllable gain and phase shifters having controllable phase to provide beam formation and directivity for transmission and/or reception of signals using the antennas 804. For example, in the context of signal transmission, the amplitude and phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 12, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 12, the power management system 805 receives a battery voltage from the battery 808. The battery 808 can be any suitable battery for use in the mobile device 800, including, for example, a lithium-ion battery.

Figure 13:
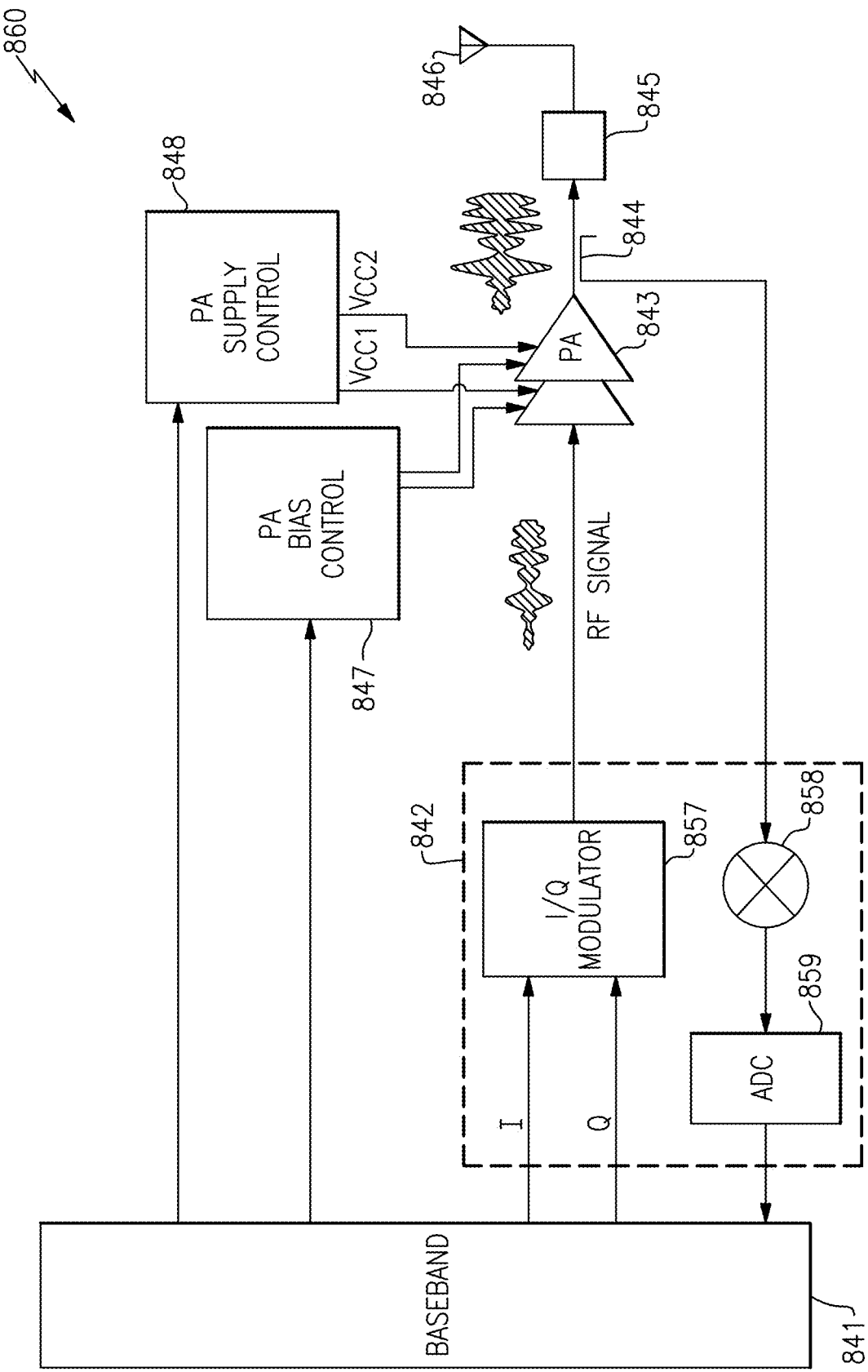
FIG. 13 is a schematic diagram of a power amplifier system according to one embodiment.

FIG. 13 is a schematic diagram of a power amplifier system 860 according to one embodiment. The illustrated power amplifier system 860 includes a baseband processor 841, a transmitter/observation receiver 842, a power amplifier (PA) 843, a directional coupler 844, front-end circuitry 845, an antenna 846, a PA bias control circuit 847, and a PA supply control circuit 848. The illustrated transmitter/observation receiver 842 includes an I/Q modulator 857, a mixer 858, and an analog-to-digital converter (ADC) 859. In certain implementations, the transmitter/observation receiver 842 is incorporated into a transceiver.

The baseband processor 841 can be used to generate an in-phase (I) signal and a quadrature-phase (Q) signal, which can be used to represent a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals can be provided to the I/Q modulator 857 in a digital format. The baseband processor 841 can be any suitable processor configured to process a baseband signal. For instance, the baseband processor 841 can include a digital signal processor, a microprocessor, a programmable core, or any combination thereof. Moreover, in some implementations, two or more baseband processors 841 can be included in the power amplifier system 860.

The I/Q modulator 857 can be configured to receive the I and Q signals from the baseband processor 841 and to process the I and Q signals to generate an RF signal. For example, the I/Q modulator 857 can include digital-to-analog converters (DACs) configured to convert the I and Q signals into an analog format, mixers for upconverting the I and Q signals to RF, and a signal combiner for combining the upconverted I and Q signals into an RF signal suitable for amplification by the power amplifier 843. In certain implementations, the I/Q modulator 857 can include one or more filters configured to filter frequency content of signals processed therein.

The power amplifier 843 can receive the RF signal from the I/Q modulator 857, and when enabled can provide an amplified RF signal to the antenna 846 via the front-end circuitry 845.

The front-end circuitry 845 can be implemented in a wide variety of ways. In one example, the front-end circuitry 845 includes one or more switches, filters, duplexers, multiplexers, and/or other components. In another example, the front-end circuitry 845 is omitted in favor of the power amplifier 843 providing the amplified RF signal directly to the antenna 846.

The directional coupler 844 senses an output signal of the power amplifier 823. Additionally, the sensed output signal from the directional coupler 844 is provided to the mixer 858, which multiplies the sensed output signal by a reference signal of a controlled frequency. The mixer 858 operates to generate a downshifted signal by downshifting the sensed output signal's frequency content. The downshifted signal can be provided to the ADC 859, which can convert the downshifted signal to a digital format suitable for processing by the baseband processor 841. Including a feedback path from the output of the power amplifier 843 to the baseband processor 841 can provide a number of advantages. For example, implementing the baseband processor 841 in this manner can aid in providing power control, compensating for transmitter impairments, and/or in performing digital pre-distortion (DPD). Although one example of a sensing path for a power amplifier is shown, other implementations are possible.

The PA supply control circuit 848 receives a power control signal from the baseband processor 841, and controls supply voltages of the power amplifier 843. In the illustrated configuration, the PA supply control circuit 848 generates a first supply voltage $V_{CC1}$ for powering an input stage of the power amplifier 843 and a second supply voltage $V_{CC2}$ for powering an output stage of the power amplifier 843. The PA supply control circuit 848 can control the voltage level of the first supply voltage $V_{CC1}$ and/or the second supply voltage $V_{CC2}$ to enhance the power amplifier system's PAE.

The PA supply control circuit 848 can employ various power management techniques to change the voltage level of one or more of the supply voltages over time to improve the power amplifier's power added efficiency (PAE), thereby reducing power dissipation.

One technique for improving efficiency of a power amplifier is average power tracking (APT), in which a DC-to-DC converter is used to generate a supply voltage for a power amplifier based on the power amplifier's average output power. Another technique for improving efficiency of a power amplifier is envelope tracking (ET), in which a supply voltage of the power amplifier is controlled in relation to the envelope of the RF signal. Thus, when a voltage level of the envelope of the RF signal increases the voltage level of the power amplifier's supply voltage can be increased. Likewise, when the voltage level of the envelope of the RF signal decreases the voltage level of the power amplifier's supply voltage can be decreased to reduce power consumption.

In certain configurations, the PA supply control circuit 848 is a multi-mode supply control circuit that can operate in multiple supply control modes including an APT mode and an ET mode. For example, the power control signal from the baseband processor 841 can instruct the PA supply control circuit 848 to operate in a particular supply control mode.

As shown in FIG. 13, the PA bias control circuit 847 receives a bias control signal from the baseband processor 841, and generates bias control signals for the power amplifier 843. In the illustrated configuration, the bias control circuit 847 generates bias control signals for both an input stage of the power amplifier 843 and an output stage of the power amplifier 843. However, other implementations are possible.

Applications

Some of the embodiments described above have provided examples in connection with mobile devices. However, the principles and advantages of the embodiments can be used for any other systems or apparatus that have needs for power amplifier systems. Examples of such RF communication systems include, but are not limited to, mobile phones, tablets, base stations, network access points, customer-premises equipment (CPE), laptops, and wearable electronics.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "may," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A mobile device comprising:
   a transceiver configured to generate a radio frequency input signal; and
   a front-end system including a compound semiconductor die and a silicon switch die, the compound semiconductor die including a first controllable impedance and a power amplifier that includes one or more power amplifier stages configured to amplify the radio frequency input signal to generate a radio frequency output signal, the silicon switch die including a band selection switch configured to receive the radio frequency output signal and a second controllable impedance, the first controllable impedance and the second controllable impedance operable to provide a bandwidth adjustment to the power amplifier.

2. The mobile device of claim 1 wherein the front-end system further includes a balun having an input side coupled to the one or more power amplifier stages and an output side coupled to the band selection switch.

3. The mobile device of claim 2 wherein the first controllable impedance includes a first controllable capacitor formed on the compound semiconductor die and in shunt with a first output of a first power amplifier stage of the one or more power amplifier stages, and the second controllable impedance includes a second controllable capacitor formed on the silicon switch die and in series between the output side of the balun and the band selection switch.

4. The mobile device of claim 3 further comprising an inductor in parallel with the second controllable capacitor.

5. The mobile device of claim 1 wherein the silicon switch die is a silicon-on-insulator die.

6. The mobile device of claim 1 wherein the front-end system further includes a plurality of band filters, the band selection switch configured to provide the radio frequency output signal to a selected band filter chosen from the plurality of band filters.

7. The mobile device of claim 1 wherein the one or more power amplifier stages includes two or more power amplifier stages configured to operate in parallel with one another to amplify the radio frequency input signal.

8. The mobile device of claim 7 wherein the front-end system further includes a balun, and the two or more power amplifier stages include a first power amplifier stage having a first output coupled to a first input terminal of the balun, and a second power amplifier stage having a second output coupled to a second input terminal of the balun.

9. The mobile device of claim 8 wherein the front-end system further includes an impedance inverter, and the two or more power amplifier stages further includes a third power amplifier stage having a third output connected to the first terminal of the balun through the impedance inverter, and a fourth power amplifier stage having a fourth output connected to the second input terminal of the balun through the impedance inverter.

10. A method of radio frequency signal amplification in a mobile device, the method comprising:
    generating a radio frequency input signal using a transceiver;
    amplifying the radio frequency input signal to generate a radio frequency output signal using a power amplifier having one or more power amplifier stages formed on a compound semiconductor die;
    providing the radio frequency output signal to a band selection switch formed on a silicon switch die; and
    providing a bandwidth adjustment to the power amplify by controlling a first controllable impedance formed on the compound semiconductor die and a second controllable impedance formed on the semiconductor switch die.

11. The method of claim 10 wherein amplifying the radio frequency input signal including using two or more power amplifier stages operating in parallel with one another to provide amplification.

12. The method of claim 10 further comprising using the band selection switch to provide the radio frequency output signal to a selected band filter chosen from a plurality of band filters.

13. A radio frequency multi-chip module comprising:
a module substrate;
a compound semiconductor die attached to the module substrate, the compound semiconductor die including a first controllable impedance and a power amplifier that includes one or more power amplifier stages configured to amplify a radio frequency input signal to generate a radio frequency output signal; and
a silicon switch die attached to the module substrate and including a band selection switch configured to receive the radio frequency output signal and a second controllable impedance, the first controllable impedance and the second controllable impedance configured to provide a bandwidth adjustment to the power amplifier.

14. The radio frequency multi-chip module of claim 13 further comprising a balun having an input side coupled to the one or more power amplifier stages and an output side coupled to the band selection switch.

15. The radio frequency multi-chip module of claim 14 wherein the first controllable impedance includes a first controllable capacitor formed on the compound semiconductor die and in shunt with a first output of a first power amplifier stage of the one or more power amplifier stages, and the second controllable impedance includes a second controllable capacitor formed on the silicon switch die and in series between the output side of the balun and the band selection switch.

16. The radio frequency multi-chip module of claim 13 wherein the silicon switch die is a silicon-on-insulator die.

17. The radio frequency multi-chip module of claim 13 further comprising a plurality of band filters attached to the module substrate, the band selection switch configured to provide the radio frequency output signal to a selected band filter chosen from the plurality of band filters.

18. The radio frequency multi-chip module of claim 13 wherein the one or more power amplifier stages including two or more power amplifier stages configured to operate in parallel with one another to amplify the radio frequency input signal.

19. The radio frequency multi-chip module of claim 18 further comprising a balun, and the two or more power amplifier stages include a first power amplifier stage having a first output coupled to a first input terminal of the balun, and a second power amplifier stage having a second output coupled to a second input terminal of the balun.

20. The radio frequency multi-chip module of claim 19 further comprising an impedance inverter, and the two or more power amplifier stages further includes a third power amplifier stage having a third output connected to the first terminal of the balun through the impedance inverter, and a fourth power amplifier stage having a fourth output connected to the second input terminal of the balun through the impedance inverter.

* * * * *